(12) United States Patent
Lee et al.

(10) Patent No.: US 10,644,083 B2
(45) Date of Patent: May 5, 2020

(54) INPUT SENSING UNIT AND DISPLAY DEVICE HAVING THE SAME

(71) Applicant: Samsung Display Co., Ltd., Yongin-si, Gyeonggi-do (KR)

(72) Inventors: Hyeon Bum Lee, Yongin-si (KR); Jeong Won Kim, Yongin-si (KR); Hyoeng Ki Kim, Yongin-si (KR); Jun Hyuk Woo, Yongin-si (KR); Dong Ki Lee, Yongin-si (KR); Eon Joo Lee, Yongin-si (KR); Jin Ho Ju, Yongin-si (KR)

(73) Assignee: Samsung Display Co., Ltd. (KR)

( * ) Notice: Subject to any disclaimer, the term of this patent is extended or adjusted under 35 U.S.C. 154(b) by 49 days.

(21) Appl. No.: 15/916,973

(22) Filed: Mar. 9, 2018

(65) Prior Publication Data
US 2019/0051711 A1   Feb. 14, 2019

(30) Foreign Application Priority Data

Aug. 8, 2017   (KR) ........................ 10-2017-0100369

(51) Int. Cl.
*H01L 27/32*   (2006.01)
*G06F 3/041*   (2006.01)
(Continued)

(52) U.S. Cl.
CPC .......... *H01L 27/3246* (2013.01); *G06F 3/044* (2013.01); *G06F 3/0412* (2013.01);
(Continued)

(58) Field of Classification Search
CPC ... G06F 3/044; G06F 3/0412; H01L 27/3246; G09G 3/3208
See application file for complete search history.

(56) References Cited

U.S. PATENT DOCUMENTS

| 9,280,242 B2 | 3/2016 | Choung et al. |
| 2013/0341651 A1 | 12/2013 | Kim et al. |

(Continued)

FOREIGN PATENT DOCUMENTS

| JP | 2016-001457 A | 1/2016 |
| JP | 2016-81529 A | 5/2016 |

(Continued)

OTHER PUBLICATIONS

Extended European Search Report, Application No. 18180192.9, dated Nov. 19, 2018, 8 pages.

*Primary Examiner* — Kent W Chang
*Assistant Examiner* — Chayce R Bibbee
(74) *Attorney, Agent, or Firm* — Innovation Counsel LLP

(57) ABSTRACT

An input sensing unit includes a base including light-transmitting areas and non-light transmitting areas. A light absorbing pattern is provided corresponding to the non-light transmitting areas and is configured to absorb incident light. A sensing electrode overlaps the light absorbing pattern. The light absorbing pattern has an aperture for exposing a light-transmitting area of the light-transmitting areas. A boundary of the aperture and an outer boundary of the light-transmitting area are spaced apart from each other. The input sensing unit has improved viewing angle/luminance ratio and improved characteristics of reflective color.

52 Claims, 20 Drawing Sheets

(51) Int. Cl.
   *G06F 3/044*     (2006.01)
   *H01L 51/52*     (2006.01)
   *G09G 3/3208*    (2016.01)

(52) U.S. Cl.
   CPC ......... *G09G 3/3208* (2013.01); *H01L 27/323* (2013.01); *H01L 27/3272* (2013.01); *H01L 51/5203* (2013.01); *H01L 51/5256* (2013.01); *H01L 51/5284* (2013.01); *G06F 2203/04112* (2013.01)

(56) References Cited

U.S. PATENT DOCUMENTS

| | | |
|---|---|---|
| 2014/0027725 A1 | 1/2014 | Lim et al. |
| 2015/0049030 A1* | 2/2015 | Her .................. G06F 3/0412 345/173 |
| 2015/0115254 A1 | 4/2015 | Choi et al. |
| 2015/0153862 A1 | 6/2015 | Nakamura et al. |
| 2015/0187857 A1 | 7/2015 | Negishi et al. |
| 2015/0243930 A1 | 8/2015 | Kim et al. |
| 2015/0277187 A1* | 10/2015 | Akasaka ........... G02F 1/133526 349/57 |
| 2016/0035795 A1* | 2/2016 | Lim .................. H01L 27/322 257/40 |
| 2016/0109998 A1 | 4/2016 | Watanabe |
| 2017/0097707 A1 | 4/2017 | Kim et al. |

FOREIGN PATENT DOCUMENTS

| | | |
|---|---|---|
| KR | 10-2014-0100091 A | 8/2014 |
| KR | 10-2015-0007062 A | 1/2015 |
| KR | 10-2015-0057019 A | 5/2015 |
| KR | 10-2016-0073533 A | 6/2016 |
| KR | 10-2017-0040423 A | 4/2017 |

* cited by examiner

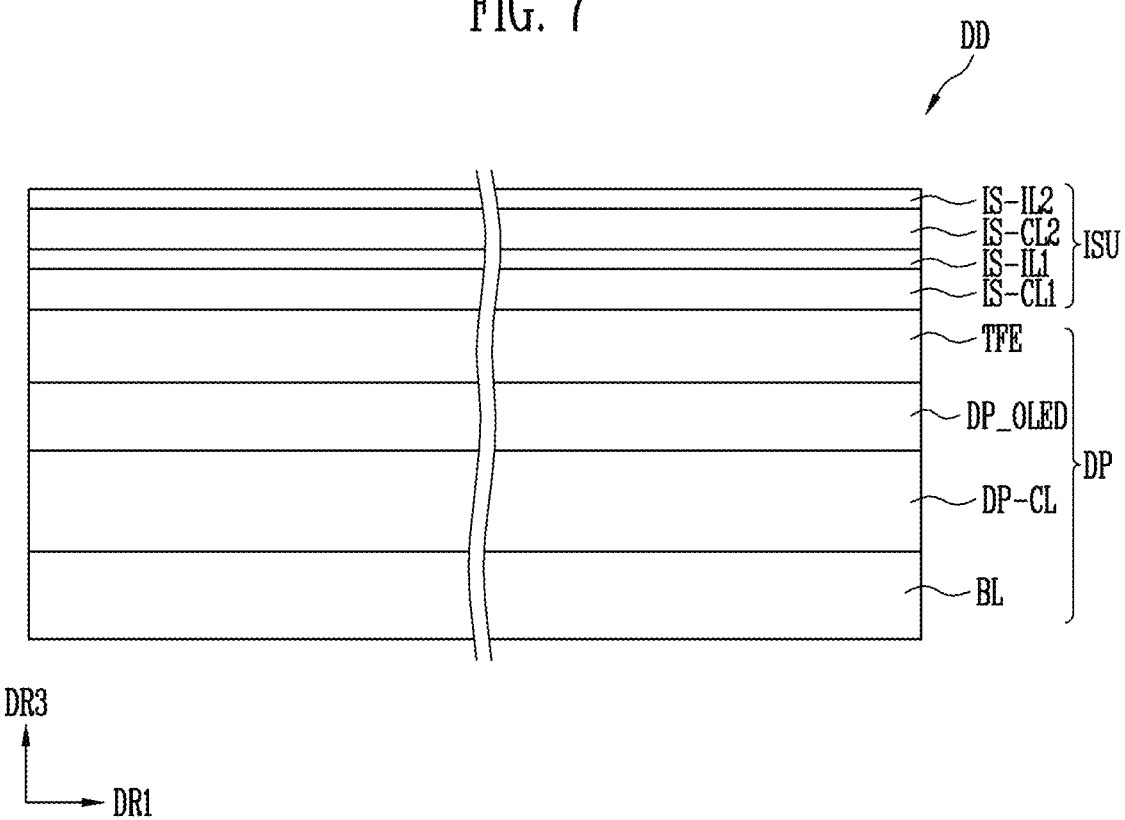

INPUT SENSING UNIT AND DISPLAY DEVICE HAVING THE SAME

CROSS-REFERENCE TO RELATED APPLICATIONS

This application claims priority to Korean Patent Application No. 10-2017-0100369, filed on Aug. 8, 2017, and all the benefits accruing therefrom under 35 U.S.C. § 119, the content of which in its entirety is herein incorporated by reference.

BACKGROUND

1. Field

Exemplary embodiments relate to an input sensing unit and a display device having the same.

2. Description of the Related Art

Recently, display devices are being equipped with an image display function along with an information input function. Typically, the information input function may be implemented as an input sensing unit for receiving a user's touch input.

The input sensing unit may be attached to one surface of a display panel implementing the image display function or may be formed as one body with the display panel. The user may input information by pressing or touching the input sensing unit while viewing images displayed on the display panel.

SUMMARY

Exemplary embodiments relate to an input sensing unit and a display device having the same with improved reflective color and improved viewing angle/luminance ratio.

An exemplary embodiment provides a display device comprising a display panel including a plurality of light emitting areas and a plurality of non-light emitting areas and an input sensing unit provided on the display panel. The display panel may comprise a base layer, a light emitting element provided on the base layer, a pixel defining layer defining a position of the light emitting element, and a sealing layer covering the light emitting element and the pixel defining layer. A light emitting area of the light emitting areas may be defined as an area on the light emitting element exposed by the pixel defining layer. The plurality of non-light emitting areas may be defined as an area on the pixel defining layer. The sealing layer may include one or more layers. The input sensing unit may comprise a light absorbing pattern provided corresponding to the plurality of non-light emitting areas and configured to absorb incident light and a sensing electrode overlapping the light absorbing pattern. The light absorbing pattern has an aperture for exposing the light emitting area. The light absorbing pattern may be provided such that a boundary of the aperture and an outer boundary of the light emitting area may be spaced from each other.

In an exemplary embodiment, a distance d between the boundary of the aperture and the outer boundary of the light emitting area may be determined by the following Equation 1, $$d = \sum_{i=1}^{k} t_i \tan\left(\frac{1}{n_i}\sin\left(D\frac{\Pi}{180°}\right)\right)$$

wherein k is a natural number, $t_i$ may be a thickness of an i-th layer of the sealing layer, $n_i$ may be a refractive index of the i-th layer of the sealing layer, and D may be a tilt angle of the display device with respect to a plane.

In an exemplary embodiment, the tilt angle D may be a viewing angle when a luminance ratio of the display device is measured for each viewing angle, and the distance d may be determined according to the Equation 1 so as to ensure the luminance ratio with the viewing angle of the display device with respect to a predetermined viewing angle.

In an exemplary embodiment, a width or area of the aperture may be larger than a width or area of the light emitting area.

In an exemplary embodiment, the boundary of the aperture may not invade the outer boundary of the light emitting area.

In an exemplary embodiment, the light absorbing pattern may overlap on the non-light emitting areas.

In an exemplary embodiment, the input sensing unit may include an insulating layer having a light path changing portion that is configured to change a path of light incident on the insulating layer corresponding to the aperture.

In an exemplary embodiment, the light path changing portion may protrude toward the light emitting area.

In an exemplary embodiment, the light path changing portion may protrude opposite the light emitting area.

In an exemplary embodiment, the insulating layer may include a first insulating layer covering the sensing electrode and a second insulating layer provided on the first insulating layer, and the light path changing portion may be provided between the first insulating layer and the second insulating layer.

In an exemplary embodiment, the second insulating layer may have a refractive index higher than a refractive index of the first insulating layer.

In an exemplary embodiment, the light path changing portion may overlap the light emitting area.

In an exemplary embodiment, a diameter or area of the light path changing portion may be smaller than or equal to a width or area of the aperture.

In an exemplary embodiment, the sensing electrode may have a mesh pattern that does not overlap the light emitting area.

In an exemplary embodiment, the mesh pattern may be provided so as to overlap the light absorbing pattern.

In an exemplary embodiment, the mesh pattern may comprise a metal line forming at least one mesh hole, and a width of the metal line may be smaller than a width of the light absorbing pattern.

In an exemplary embodiment, the mesh hole may be larger than the aperture.

In an exemplary embodiment, the sensing electrode may include a first mesh pattern and a second mesh pattern, and the second mesh pattern may be located on and separated from the first mesh pattern and may be electrically connected to the first mesh pattern by at least one contact portion.

In an exemplary embodiment, the light absorbing pattern may be disposed between the first mesh pattern and the second mesh pattern, and the at least one contact portion may electrically connect the first mesh pattern and the second mesh pattern through a connection contact hole in the light absorbing pattern.

In an exemplary embodiment, the input sensing unit may include an insulating layer having a multilayer structure including a plurality of insulating layers. At least one insulating layer, among the plurality of insulating layers, may be disposed between the first mesh pattern and the second mesh pattern. The at least one contact portion may electrically connect the first mesh pattern and the second mesh pattern through a connection contact hole passing through the at least one insulating layer disposed between the first mesh pattern and the second mesh pattern.

In an exemplary embodiment, the first mesh pattern may be located on the light absorbing pattern.

In an exemplary embodiment, the light absorbing pattern may be located on the second mesh pattern.

In an exemplary embodiment, the sensing electrode may comprise a first sensing electrode extending in a first direction and a second sensing electrode extending in a second direction intersecting the first direction. The first sensing electrode may include a plurality of first sensing portions arranged along the first direction and a plurality of first connecting portions connecting the first sensing portions to each other. The second sensing electrode may include a plurality of second sensing portions arranged along the second direction and a plurality of second connecting portions connecting the second sensing portions to each other. The plurality of first sensing portions and the plurality of second sensing portions may be disposed on the same layer or on different layers. Either the plurality of first connection portions or the plurality of second connection portions may be disposed on the same layer as the first sensing portions.

In an exemplary embodiment, the display device may further comprise a reflection preventing unit configured to prevent external light incident on the display device from being reflected in the display device and going out.

In an exemplary embodiment, the reflection preventing unit may be provided on the input sensing unit, and the light absorbing pattern may be configured to absorb light incident on the light absorbing pattern among the external light reflected in the display device.

An exemplary embodiment is to provide a display device comprising a display panel including a plurality of light emitting areas and a plurality of non-light emitting areas and an input sensing unit provided on the display panel. The display panel may comprise a base layer, a light emitting element provided on the base layer, a pixel defining layer defining a position of the light emitting element, and a sealing layer covering the light emitting element and the pixel defining layer. In an exemplary embodiment, a light emitting area of the light emitting areas may be defined as an area on the light emitting element exposed by the pixel defining layer, and each of the plurality of non-light emitting areas may be defined as an area on the pixel defining layer. The input sensing unit may comprise a light absorbing pattern provided corresponding to the plurality of non-light emitting areas and configured to absorb incident light, and a sensing electrode overlapping the light absorbing pattern. The light absorbing pattern has an aperture for exposing the light emitting area. A boundary of the aperture and an outer boundary of the light emitting area are spaced apart from each other and a luminance ratio according to a viewing angle of the display device is equal to or greater than a predetermined value.

In an exemplary embodiment, a distance between the boundary of the aperture and the outer boundary of the light emitting area may be set so that the luminance ratio of the display device at the viewing angle of 45° is 50% or more.

In an exemplary embodiment, a distance d between the boundary of the aperture and the outer boundary of the light emitting areas may be determined by the following Equation 2, $$d = \sum_{i=1}^{k} t_i \tan\left(\frac{1}{n_i}\sin\left(D\frac{\Pi}{180°}\right)\right)$$

wherein k may be a natural number, $t_i$ may be a thickness of an i-th layer of the sealing layer, $n_i$ may be a refractive index of the i-th layer of the sealing layer, and D may be a tilt angle of the display device with respect to a plane.

In an exemplary embodiment, the tilt angle D may be the viewing angle when the luminance ratio of the display device is measured for each viewing angle, and the distance d may be determined according to the Equation 2 so as to ensure the luminance ratio with the viewing angle of the display device with respect to a predetermined viewing angle.

An exemplary embodiment provides an input sensing unit comprising a base including a plurality of light-transmitting areas and non-light transmitting areas between adjacent light-transmitting areas of the plurality of light-transmitting areas, a light absorbing pattern provided corresponding to the non-light transmitting areas and configured to absorb incident light, and a sensing electrode overlapping the light absorbing pattern. The light absorbing pattern may have an aperture for exposing a light-transmitting area of the light-transmitting areas. A boundary of the aperture and an outer boundary of the light-transmitting areas may be spaced apart from each other. When the input sensing unit is provided on the display device, the luminance ratio according to the viewing angle of a display device may have a predetermined value or more.

In an exemplary embodiment, a distance between the boundary of the aperture and the outer boundary of the light-transmitting area may be set so that the luminance ratio of the display device at the viewing angle of 45° is 50% or more.

In an exemplary embodiment, when the display device may include a display panel having a light emitting element and a sealing layer covering the light emitting element, a distance d between the boundary of the aperture and the outer boundary of the light-transmitting area may be determined by the following Equation 3, $$d = \sum_{i=1}^{k} t_i \tan\left(\frac{1}{n_i}\sin\left(D\frac{\Pi}{180°}\right)\right)$$

wherein k may be a natural number, $t_i$ may be a thickness of a i-th layer of the sealing layer, $n_i$ may be a refractive index of the i-th layer of the sealing layer, and D may be a tilt angle of the display device with respect to a plane.

In an exemplary embodiment, a width or area of the aperture may be larger than a width or area of the light-transmitting area.

In an exemplary embodiment, the boundary of the aperture may not invade the outer boundary of the light-transmitting area.

In an exemplary embodiment, the light absorbing pattern may overlap on the non-light transmitting areas.

In an exemplary embodiment, the input sensing unit may further comprise an insulating layer having a light path changing portion that is configured to change a path of light incident on the insulating layer corresponding to the aperture.

In an exemplary embodiment, the light path changing portion may protrude toward the light-transmitting area.

In an exemplary embodiment, the light path changing portion may protrude opposite the light-transmitting area.

In an exemplary embodiment, the insulating layer may include a first insulating layer covering the sensing electrode and a second insulating layer provided on the first insulating layer, and the light path changing portion may be provided between the first insulating layer and the second insulating layer.

In an exemplary embodiment, the second insulating layer may have a refractive index higher than a refractive index of the first insulating layer.

In an exemplary embodiment, the light path changing portion may overlap the light-transmitting area.

In an exemplary embodiment, a diameter or area of the light path changing portion may be smaller than or equal to a width or area of the aperture.

In an exemplary embodiment, the sensing electrode may have a mesh pattern that does not overlap the light-transmitting area.

In an exemplary embodiment, the mesh pattern may be provided so as to overlap the light absorbing pattern.

In an exemplary embodiment, the mesh pattern may comprise a metal line forming at least one mesh hole, and a width of the metal line may be smaller than a width of the light absorbing pattern.

In an exemplary embodiment, the mesh hole may be larger than the aperture

In an exemplary embodiment, the sensing electrode may include a first mesh pattern and a second mesh pattern, and the second mesh pattern may be located on and separated from the first mesh pattern and may be electrically connected to the first mesh pattern by at least one contact portion.

In an exemplary embodiment, the light absorbing pattern may be disposed between the first mesh pattern and the second mesh pattern, and the contact portion may electrically connect the first mesh pattern and the second mesh pattern through a connection contact hole in the light absorbing pattern.

In an exemplary embodiment, the input sensing unit may further comprise an insulating layer having a multilayer structure including a plurality of insulating layers. At least one insulating layer, among the plurality of insulating layers, may be disposed between the first mesh pattern and the second mesh pattern. The contact portion may electrically connect the first mesh pattern and the second mesh pattern through a connection contact hole passing through the at least one insulating layer disposed between the first mesh pattern and the second mesh pattern.

In an exemplary embodiment, the first mesh pattern may be located on the light absorbing pattern.

In an exemplary embodiment, the light absorbing pattern may be located on the second mesh pattern.

In an exemplary embodiment, the sensing electrode may comprise a first sensing electrode extending in a first direction and a second sensing electrode extending in a second direction intersecting the first direction. The first sensing electrode may include a plurality of first sensing portions arranged along the first direction and a plurality of first connecting portions connecting the first sensing portions to each other. The second sensing electrode may include a plurality of second sensing portions arranged along the second direction and a plurality of second connecting portions connecting the second sensing portions to each other. The plurality of first sensing portions and the plurality of second sensing portions may be disposed on the same layer or on different layers. Either the plurality of first connecting portions or the plurality of second connecting portions may be disposed on the same layer as the first sensing portions.

In an exemplary embodiment, the input sensing unit may further comprise a reflection preventing unit configured for preventing external light incident on the display device from being reflected in the display device and going out.

In an exemplary embodiment, the reflection preventing unit may be provided on the input sensing unit, and the light absorbing pattern may be configured to absorb light incident on the light absorbing pattern among the external light reflected in the display device.

BRIEF DESCRIPTION OF THE DRAWINGS

Example embodiments will now be described more fully hereinafter with reference to the accompanying drawings; however, they may be embodied in different forms and should not be construed as limited to the exemplary embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

FIG. 7 is a cross-sectional view illustrating an exemplary embodiment of a display device;

DETAILED DESCRIPTION

Figure 1:
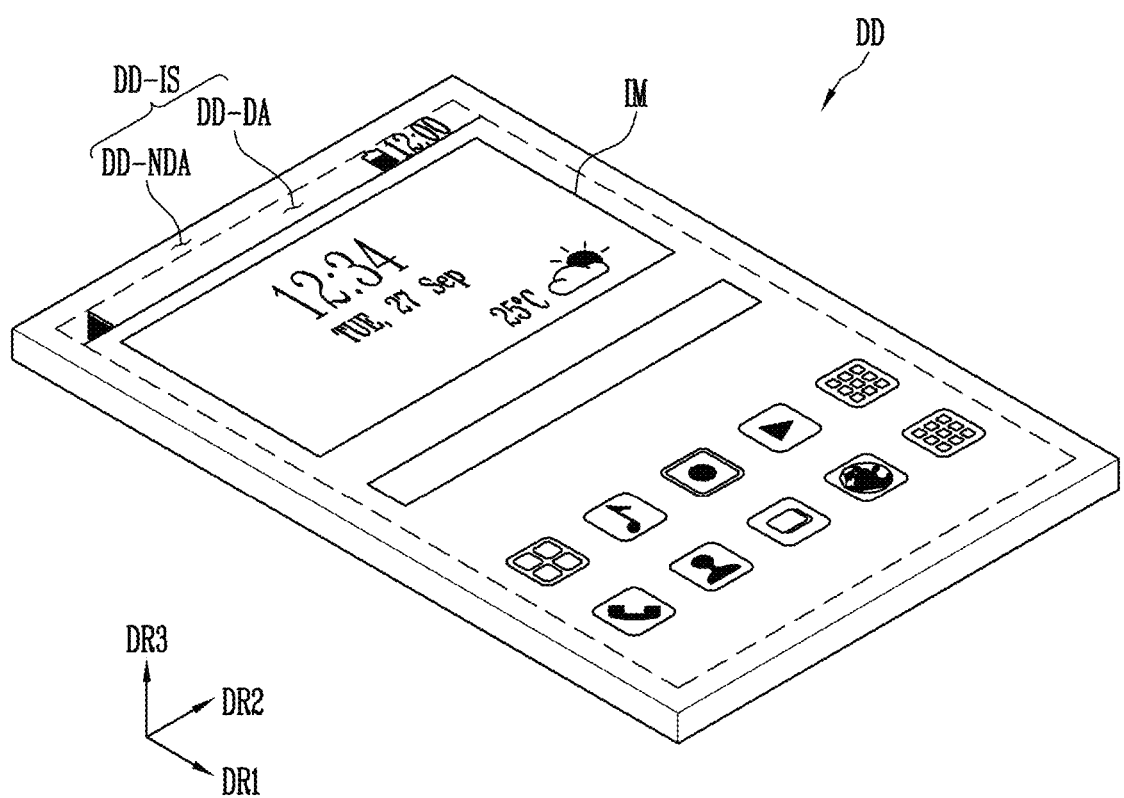
FIG. 1 is a perspective view illustrating an exemplary embodiment of a display device.

The inventive concept may be modified variably and may have various embodiments, particular examples of which will be illustrated in drawings and described in detail. However, it is to be understood that the inventive concept is not limited to a specific disclosed form, but includes all modifications, equivalents, and substitutions without departing from the scope and spirit of the inventive concept.

In describing drawings, like numbers refer to like elements. In the accompanying drawings, dimensions of structures are exaggerated to clarify the inventive concept. While terms such as "first" and "second," etc., may be used to describe various components, such components must not be understood as being limited to the above terms. The above terms are used only to distinguish one component from another. For example, a first component may be referred to as a second component without departing from the scope of the inventive concept, and likewise a second component may be referred to as a first component. As used herein, the singular forms "a", "an" and "the" are intended to include the plural forms as well, unless the context clearly indicates otherwise.

In the application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added. In addition, it will be understood that when an element such as a layer, film, region, or substrate is referred to as being "on" another element, it may be directly on the other element or intervening elements may also be present. Conversely, it will be understood that when an element such as a layer, film, region, or substrate is referred to as being "beneath" another element, it may be directly beneath the other element or intervening elements may also be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the Figures is turned over, elements described as being on the "lower" side of other elements would then be oriented on "upper" sides of the other elements. The exemplary term "lower," may therefore, encompasses both an orientation of "lower" and "upper," depending on the particular orientation of the Figure. Similarly, when the device in one of the Figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and the inventive concept, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the Figures are schematic in nature and their shapes are not intended to illustrate the precise shape of a region and are not intended to limit the scope of the claims.

Hereinafter, an exemplary embodiment will be described with reference to the accompanying drawings.

FIG. 1 is a perspective view illustrating a display device DD according to an exemplary embodiment. Referring to FIG. 1, the display device DD according to an exemplary embodiment may display an image IM on a display surface DD-IS. The display surface DD-IS may be parallel to a plane defined by a first direction axis DR1 and a second direction axis DR2. A normal direction of the display surface DD-IS, i.e., the thickness direction of the display device DD may be indicated by a third direction axis DR3.

A front surface (or an upper surface) and a back surface (or a lower surface) of each of members or units described below may be distinguished by the third direction axis DR3. However, the first, second, and third direction axes DR1, DR2, and DR3 shown in the embodiment may be merely examples, and the directions indicated by the first, second, and third direction axes DR1, DR2, and DR3 may correspond to relative concepts and be converted into other directions. Hereinafter, the first, second, and third directions refer to the same reference characters as the directions indicated by the first, second, and third direction axes DR1, DR2, and DR3, respectively.

The display device DD shown in FIG. 1 may have a planar display surface. The embodiments are not limited thereto, and the display device DD according to an embodiment may have various types of display surfaces capable of displaying an image, such as a curved display surface or a stereoscopic display surface. When the display device DD according to an embodiment has a stereoscopic display surface, the stereoscopic display surface may include a plurality of display areas oriented in different directions as an example. The stereoscopic display surface may be embodied as a polygonal columnar display surface.

The display device DD according to the embodiment may be a flexible display device. The embodiments are not limited thereto, and it may be a rigid display device.

FIG. 1 exemplarily shows the display device DD which may be applied to a mobile phone terminal. Although not shown in FIG. 1, the display device DD may configure a mobile phone terminal when the display device DD is disposed in a bracket or case together with electronic modules, a camera module, and a power module mounted on a main board. The display device DD according to an exemplary embodiment may be applied to small and medium electronic devices such as a tablet, a car navigation system, a game machine, and the like as well as large electronic devices such as televisions, monitors, electric sign boards, and the like.

As shown FIG. 1, the display surface DD-IS of the display device DD may be divided into a display area DD-DA in which the image IM is displayed and a non-display area DD-NDA adjacent to the display area DD. The non-display area DD-NDA is an area where no image is displayed. The non-display area DD-NDA may be disposed outside the display area DD-DA.

The display surface DD-IS of the display device DD may be a square. In this case, the non-display area DD-NDA may surround the four sides of the display area DD-DA which is a quadrangle. The embodiments are not limited thereto and the display surface DD-IS of the display device DD according to an embodiment may have various shapes that may display the image IM. For example, the display surface DD-IS of the display device DD may have various shapes such as a circle or a polygon such as a triangle, a pentagon, or the like. The shape of the display area DD-DA and the shape of the non-display area DD-NDA may be designed to be relative to each other.

Figure 2:
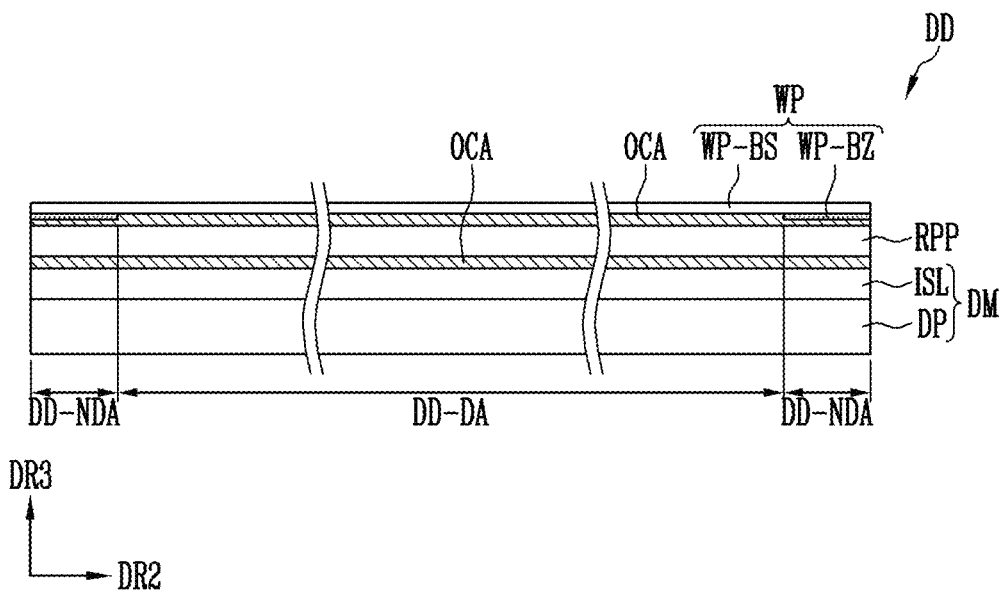
FIG. 2 is a cross-sectional view illustrating an exemplary embodiment of a display device.

FIG. 2 is a cross-sectional view schematically showing the display device DD according to an embodiment. FIG. 2 is a sectional view of the display device DD according to a section defined by the second direction axis DR2 and the third direction axis DR3. FIG. 2 is merely shown to illustrate the stacking relationship of functional panels and/or functional units constituting the display device DD.

Referring to FIG. 2, the display device DD according to an exemplary embodiment may include a display panel DP, an input sensing unit, a reflection preventing unit, and a window unit. At least some of the display panel DP, the input sensing unit, the reflection preventing unit, and the window unit may be formed by a continuous process, or at least some of the elements may be coupled to each other through an adhesive member OCA. The adhesive member OCA may include a conventional adhesive or a pressure-sensitive adhesive. The adhesive member OCA shown in FIG. 2 may be an optical clear adhesive OCA as an example.

In one embodiment, the input sensing unit may sense a touch or input by an external medium, such as a hand or a pen, to the display surface DD-IS of the display device DD.

In one embodiment, the input sensing unit, the reflection preventing unit, and the window unit may be replaced with other elements, or may be omitted.

In FIG. 2, in the case where one of the input detecting unit, the reflection preventing unit, and the window unit is formed as a continuous process with another element, the corresponding one may be expressed as a "layer". When one of the input sensing unit ISU, the reflection preventing unit, and the window unit is coupled to another element through the adhesive member, the corresponding one may be expressed as a "panel". The "panel" may include a base layer providing a base surface, such as a synthetic resin film, a composite film, a glass substrate, etc. However, in terms of the "layer," the base layer may not be formed. In other words, the units expressed as the "layer" may be placed on the base surface provided by another unit.

The input sensing unit, the reflection preventing unit and the window unit may be referred to as an input sensing panel, a reflection preventing panel RPP, and a window panel WP, or an input sensing layer ISL, a reflection preventing layer, and a window layer, respectively, depending on the presence or absence of the base layer.

As shown in FIG. 2, the display device DD according to an embodiment may include the display panel DP, the input sensing layer ISL, the reflection preventing panel RPP, and the window panel WP.

The input sensing layer ISL may be an input sensing unit and be disposed directly on the display panel DP. In this specification, an expression "the element B is directly disposed on the element A" may mean that no separate adhesive layer/adhesion member is disposed between the element A and the element B. The element B may be formed through a continuous process on the base surface provided by the element A after the element A is formed. Therefore, since the input sensing layer ISL shown in FIG. 2 is disposed directly on the display panel DP, the input sensing layer ISL may by formed by a continuous process with one surface of the display panel DP as a base surface without a separate adhesive layer/adhesion member.

The display module DM may include the display panel DP and the input sensing layer ISL disposed directly on the display panel DP. The optical clear adhesive OCA may be disposed between the display module DM and the reflection preventing panel RPP and between the reflection preventing panel RPP and the window panel WP. In other words, the optical clear adhesive OCA may be disposed between the display module DM and the reflection preventing panel RPP to attach the reflection preventing panel RPP to the display module DM. In addition, the optical clear adhesive OCA may be disposed between the reflection preventing panel RPP and the window WP to attach the reflection preventing panel RPP to the window WP.

The optical clear adhesive OCA may transmit more than 97% of light, so that it may function as glass and improve the clarity of the display surface DD-IS compared to a conventional double-sided adhesive.

The input sensing layer ISL may acquire coordinate information of an external input (e.g., a touch event) to the display surface DD-IS of the display device DD. The input sensing layer ISL may be disposed in or on the display panel DP.

Although not shown separately, the display module DM according to an embodiment may further include a protection member disposed on the lower surface of the display panel DP. The protective member and the display panel DP may be coupled with an adhesive member.

The display panel DP according to an embodiment may be an emissive display panel and is not particularly limited. For example, the display panel DP may be an organic light emitting display panel or a quantum dot light emitting display panel. The light emitting layer of the organic light emitting display panel may include an organic light emitting material. A luminescent layer of the quantum dot luminescent display panel may include a quantum dot, a quantum rod, and the like. Hereinafter, the display panel DP is described as an organic light emitting display panel.

The reflection preventing panel RPP may reduce the reflectance of external light incident from above the window panel WP. When external light is incident into the display device DD, the external light may be reflected inside the display device DD, in particular, a thin film transistor (TFT) or an electrode in the display panel DP, and may be emitted to the outside of the display device DD again. External light reflection may weaken outdoor visibility and deteriorate reflective color. The reflection preventing panel RPP may prevent the external light incident into the display device DD from being reflected in the display device DD and emitted to the outside.

The organic light emitting display panel may be more vulnerable to external light reflection than an LCD display panel. The LCD display panel may block external light reflected by a liquid crystal layer. However, since the organic light emitting display panel does not have a liquid crystal layer blocking external light, the organic light emitting display panel may be structurally vulnerable to external light reflection as compared with the LCD display panel. The reflection preventing panel RPP may be provided on the organic light emitting display panel to reduce the external light reflectance. However, the reflection prevention panel RPP alone of the organic light emitting display panel may less inhibit external light reflection than the LCD display panel, so that the organic light emitting display panel may have difficulty in realizing real black because of deterioration of characteristic of reflective color. This will be described below.

The reflection preventing panel RPP may include a phase retarder and a polarizer. The phase retarder may be of a film type or a liquid crystal coating type, and may include a λ/2 phase retarder and/or a λ/4 phase retarder. The polarizer may also be of a film type or a liquid crystal coating type. The film type may include a stretch-type synthetic resin film, and the liquid crystal coating type may include liquid crystals arranged in a predetermined arrangement. The phase retarder and the polarizer may further comprise a protective film. The phase retarder, the polarizer or the protective film may be defined as the base layer of the reflection preventing panel RPP.

The reflection preventing panel RPP may include color filters. The color filters may have a predetermined arrangement. The predetermined arrangement of the color filters may be determined in consideration of light emission colors of the pixels included in the display panel DP. The reflection preventing panel RPP may further include a black matrix adjacent to the color filters.

The reflection preventing panel RPP may include a destructive interference structure. For example, the destructive interference structure may comprise a first reflective layer and a second reflective layer disposed on different layers. A first reflected light and a second reflected light reflected by the first reflection layer and the second reflection layer, respectively, may be canceled out. Thus, the external light reflectance may be reduced.

The window panel WP may include a base film WP-BS and a light blocking pattern WP-BZ. The base film WP-BS may include a glass substrate and/or a synthetic resin film. The base film WP-BS is not limited to a single layer. The base film WP-BS may comprise two or more films joined with an adhesive member.

The light blocking pattern WP-BZ may be partially overlapped with the base film WP-BS. The light blocking pattern WP-BZ may be disposed on the back surface of the base film WP-BS and define a bezel area of the display device DD, that is, the non-display area DD-NDA (see FIG. 1).

The light blocking pattern WP-BZ may be a colored organic film. The light blocking pattern WP-BZ may be formed by a coating method as an example.

Although not shown separately, the window panel WP may further include a functional coating layer disposed on the front surface of the base film WP-BS. The functional coating layer may include an anti-fingerprint layer, an anti-reflection layer, and a hard coat layer.

Referring to FIG. 2, the input sensing layer ISL may overlap the entire surface of the display panel DP. However, as a modification, the input sensing layer ISL may overlap only a part of the display area DD-DA, or may overlap only the non-display area DD-NDA.

The input sensing layer ISL may be a touch sensing panel which senses a user's touch, or a fingerprint sensing panel sensing fingerprint information of the user's finger. The pitch and width of the sensing electrodes described below may be changed depending on the use of the input sensing layer ISL. The sensing electrodes of the touch sensing panel may have a width of several millimeters (mm) to tens of millimeters (mm), and the sensing electrodes of the fingerprint sensing panel may have a width of tens of micrometers (μm) to hundreds of micrometers (μm).

Figure 3:
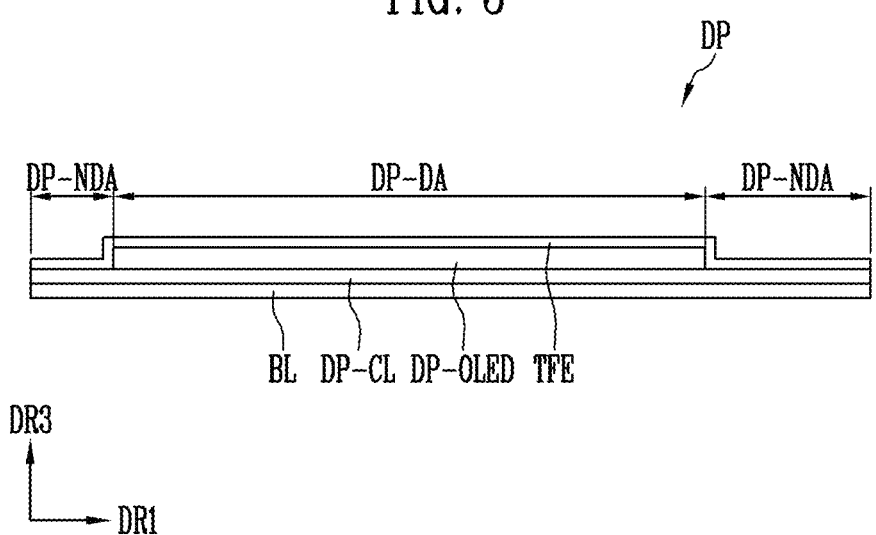
FIG. 3 is a cross-sectional view illustrating an exemplary embodiment of a display panel.
Figure 4:
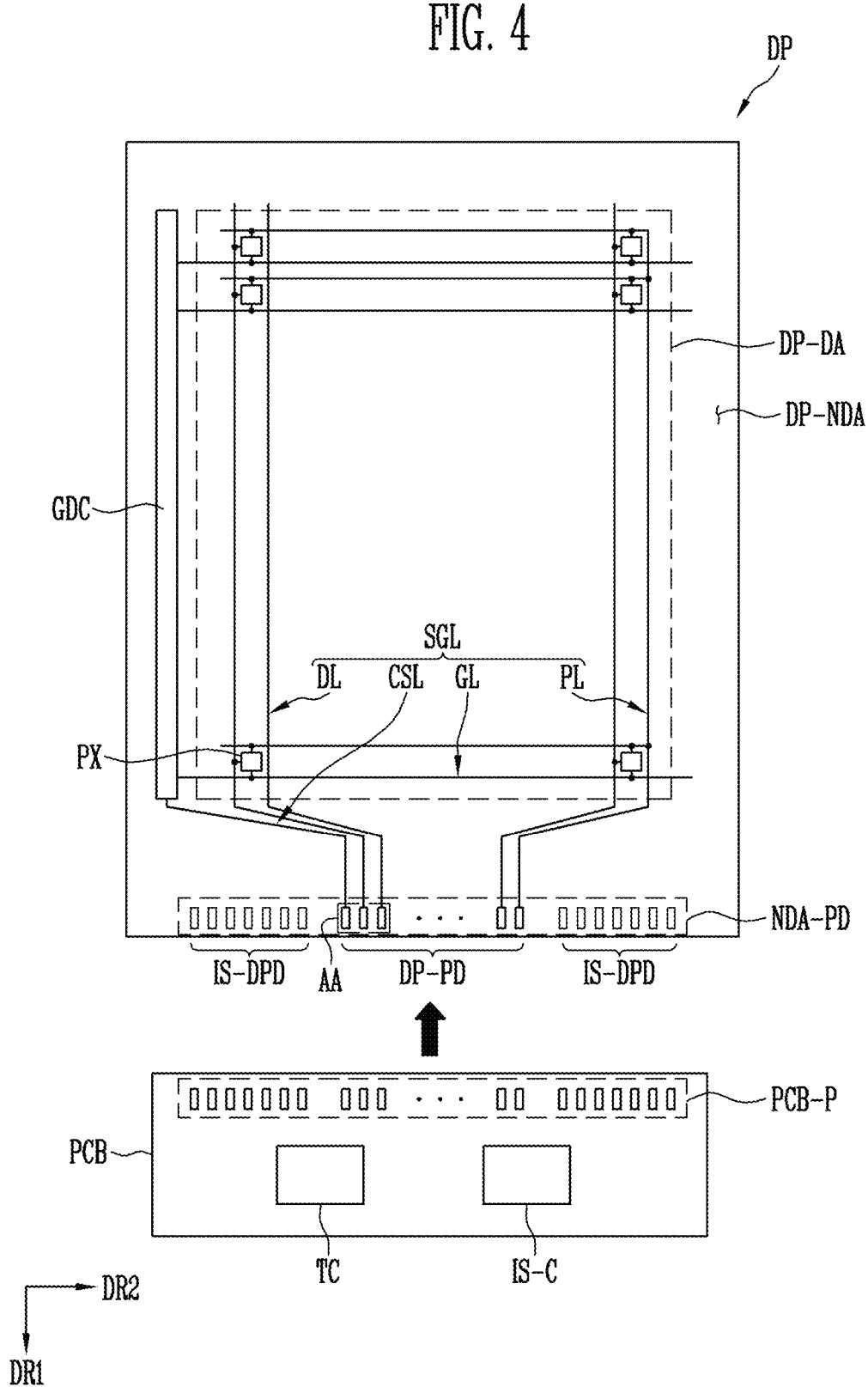
FIG. 4 is a plan view illustrating an exemplary embodiment of a display panel.
Figure 5:
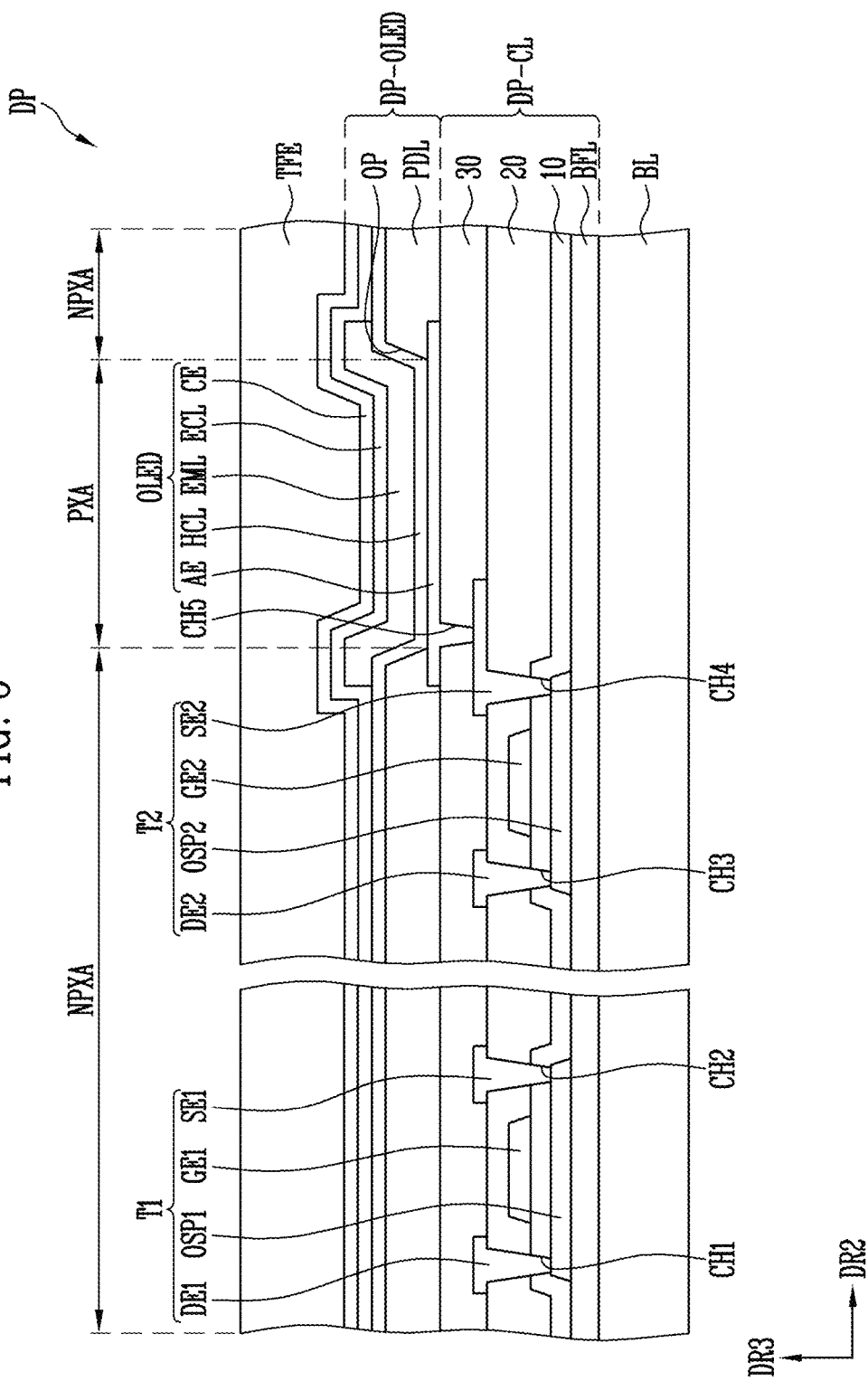
FIG. 5 is an enlarged cross-sectional view of an exemplary embodiment of a display panel.

FIG. 3 is a cross-sectional view of the display panel DP according to an embodiment. FIG. 4 is a plan view of the display panel DP according to an embodiment. FIG. 5 is an enlarged cross-sectional view of the display panel DP according to an embodiment. The display panel DP described below may be applied to all of the display devices DD described with reference to FIG. 2.

As shown in FIG. 3, the display panel DP may include a base layer BL, a circuit element layer DP-CL arranged on the base layer BL, a display element layer DP-OLED and a thin film encapsulating layer TFE. Although not shown separately, the display panel DP may further include a plurality of functional layers such as a reflection preventing layer, a refractive index control layer, and the like.

The base layer BL may include a synthetic resin film. A synthetic resin layer may be formed on a working substrate used in manufacturing the display panel DP. Subsequently, a conductive layer, an insulating layer, and the like may be formed on the synthetic resin layer. When the working substrate is removed, the synthetic resin layer may correspond to the base layer BL. The synthetic resin layer may be a polyimide-based resin layer, and a material thereof is not particularly limited. In addition, the base layer BL may include a glass substrate, a metal substrate, or an organic/inorganic composite substrate.

The circuit element layer DP-CL may comprise at least one insulating layer and at least one circuit element. Hereinafter, the insulating layer included in the circuit element layer DP-CL may be referred to as an intermediate insulating layer. The intermediate insulating layer may comprise at least one intermediate inorganic film and at least one intermediate organic film. The circuit element may include a signal line, a pixel driver circuit, and the like. The circuit element layer DP-CL may be formed by processes for forming an insulating layer, a semiconductor layer, and a conductive layer by coating, vapor deposition, or the like, and a patterning process of an insulating layer, a semiconductor layer, and a conductive layer by a photolithography process.

The display element layer DP-OLED may include a light emitting element. The display element layer DP-OLED may include a plurality of organic light emitting diodes. The display element layer DP-OLED may further include an organic layer such as a pixel defining layer.

The thin film encapsulating layer TFE may seal the display element layer DP-OLED. The thin film encapsulating layer TFE may comprise at least one insulating layer. The thin film encapsulating layer TFE according to an embodiment may include at least one inorganic film (hereinafter referred to as a sealing inorganic film). The thin film encapsulating layer TFE according to an embodiment may include at least one organic film (hereinafter referred to as a sealing organic film) and at least one sealing inorganic film.

The sealing inorganic film may protect the display element layer DP-OLED from moisture or oxygen. In addition, the sealing organic film may protect the display element layer DP-OLED from foreign substances such as dust particles. The sealing inorganic film may include a silicon nitride layer, a silicon oxynitride layer, a silicon oxide layer, a titanium oxide layer, or an aluminum oxide layer. The embodiments are not limited thereto and may be made of an inorganic material capable of protecting the display element layer from moisture or oxygen. The sealing organic film may include an acrylic based organic film, but the embodiments are not limited thereto, and may be made of an organic material capable of protecting the display element layer from foreign substances such as dust particles.

As shown in FIG. 4, the display panel DP may include a display area DP-DA and a non-display area DP-NDA on a plane. In this embodiment, the non-display area DP-NDA may be defined along the edge of the display area DP-DA. The display area DP-DA and the non-display area DP-NDA of the display panel DP may correspond to the display area DD-DA and the non-display area DD-NDA of the display device DD shown in FIGS. 1 and 2, respectively.

The display panel DP may include a driver circuit GDC, a plurality of signal lines SGL, a plurality of signal pads DP-PD, and a plurality of pixels PX. The plurality of pixels PX may be disposed in the display area DA. Each of the pixels PX may include an organic light emitting diode and a pixel driver circuit connected thereto. The driver circuit GDC, the plurality of signal lines SGL, the plurality of signal pads DP-PD, and a pixel driver circuit may be included in the circuit element layer DP-CL shown in FIG. 3.

The driver circuit GDC may include a scan driver circuit. The scan driver circuit may generate a plurality of scan signals, and sequentially output the scan signals to a plurality of scan lines GL described below. The scan driver circuit may further output another control signal to the driver circuit of the plurality of pixels PX.

The scan driver circuit may include a plurality of thin film transistors. The plurality of thin film transistors may be formed by the same process as the driver circuit of the pixels PX. For example, the plurality of thin film transistors may be formed by a low temperature polycrystalline silicon (LTPS) process or a low temperature polycrystalline oxide (LTPO) process.

The signal lines SGL may include the scan lines GL, data lines DL, a power supply line PL, and a control signal line CSL. Each of the scan lines GL may be respectively connected to a corresponding one of the pixels PX and each of the data lines DL may be connected to a corresponding one of the pixels PX. The power supply line PL may be connected to each of the pixels PX. The control signal line CSL may provide control signals to the scan driver circuit.

The signal lines SGL may overlap the display area DP-DA and the non-display area DP-NDA. The signal lines SGL may include a pad portion and a line portion. The line portion may overlap the display area DP-DA and the non-display area DP-NDA. The pad portion may be connected to an end of the line portion. The pad portion may be disposed in the non-display area DP-NDA and overlap a corresponding one of the signal pads DP-PD. A detailed description thereof will be described below. The area where the signal pads DP-PD are disposed in the non-display area DP-NDA may be defined as a pad area NDA-PD.

The line portion connected to the pixels PX may substantially constitute most of the signal lines SGL. The line portion may be connected to transistors T1 and T2 (see FIG. 5) of the pixel PX. The line portion may have a single-layer or multilayer structure. The line portion may be a single body or may include two or more parts. The two or more parts may be disposed on different layers and may be connected to each other through a contact hole passing through an insulating layer disposed between the two or more parts.

The display panel DP may further include dummy pads IS-DPD disposed in the pad area NDA-PD. The dummy pads IS-DPD may be formed through the same process as the signal lines SGL, and thus may be disposed on the same layer as the signal lines SGL. The dummy pads IS-DPD may be selectively provided in the display device DD including the input sensing layer ISL as shown in FIG. 2, and may be omitted from the display device DD including the input sensing unit ISU.

The dummy pads IS-DPD may overlap the pad portion of the signal lines SGL provided in the input sensing layer ISL shown in FIG. 2. The dummy pads IS-DPD may be floating electrodes. The dummy pads IS-DPD may be electrically insulated from the signal lines SGL of the display panel DP. A detailed description thereof will be described below.

In FIG. 4, a circuit board PCB electrically connected to the display panel DP is additionally shown. The circuit board PCB may be a rigid circuit board or a flexible circuit board. The circuit board PCB may be directly coupled to the display panel DP, or may be connected to the display panel DP via another circuit board.

A timing control circuit TC for controlling an operation of the display panel DP may be provided on the circuit board PCB. Further, an input sensing circuit IS-C for controlling the input sensing unit ISU or the input sensing layer ISL may be provided on the circuit board PCB. Each of the timing control circuit TC and the input sensing circuit IS-C may be mounted on the circuit board PCB in the form of an integrated chip. As another example, the timing control circuit TC and the input sensing circuit IS-C may be mounted in the form of a single integrated chip on the circuit board PCB. The circuit board PCB may include circuit board pads PCB-P electrically connected to the display panel DP. The circuit board PCB may further include signal lines connecting the circuit board pads PCB-P with the timing control circuit TC and/or the input sensing circuit IS-C.

FIG. 5 is an enlarged cross-sectional view of the display panel DP according to an embodiment. Referring to FIG. 5, the display panel DP according to an embodiment may include the circuit element layer DP-CL, the display element layer DP-OLED, and the thin film encapsulating layer TFE which are sequentially arranged on the base layer BL.

The circuit element layer DP-CL may include a buffer film BFL which is an inorganic film, a first intermediate inorganic film 10, a second intermediate inorganic film 20, and an intermediate organic film 30. The material of the inorganic film and the organic film is not particularly limited. In one embodiment, the buffer film BFL may be selectively arranged or omitted.

A semiconductor pattern OSP1 (hereinafter referred to as a first semiconductor pattern) of the first transistor T1 and a semiconductor pattern OSP2 (hereinafter referred to as a second semiconductor pattern) of the second transistor T2 may be disposed on the buffer film BFL. The first semiconductor pattern OSP1 and the second semiconductor pattern OSP2 may be selected from amorphous silicon, polysilicon, or a metal oxide semiconductor.

The first intermediate inorganic film 10 may be disposed on the first semiconductor pattern OSP1 and the second semiconductor pattern OSP2. A control electrode GE1 (hereinafter, a "first control electrode") of the first transistor T1 and a control electrode GE2 (hereinafter, a "second control electrode") of the second transistor T2 may be disposed on the first intermediate inorganic film 10. The first control electrode GE1 and the second control electrode GE2 may be manufactured by the same photolithography process as the scan lines GL (see FIG. 4).

The second intermediate inorganic film 20 covering the first control electrode GE1 and the second control electrode GE2 may be disposed on the first intermediate inorganic film 10. An input electrode DE1 (hereinafter referred to as a first input electrode) and an output electrode SE1 (hereinafter referred to as first output electrode) of the first transistor T1, and an input electrode DE2 (hereinafter referred to as a second input electrode) and an output electrode SE2 (hereinafter referred to as a second output electrode) of the second transistor T2 may be disposed on the second intermediate inorganic film 20.

The first input electrode DE1 may be connected to the first semiconductor pattern OSP1 through a first through hole CH1 passing through the first intermediate inorganic film 10 and the second intermediate inorganic film 20. The first output electrode SE1 may be connected to the first semiconductor pattern OSP1 through a second through hole CH2 passing through the first intermediate inorganic film 10 and the second intermediate inorganic film 20. The second input electrode DE2 may be connected to the first semiconductor pattern OSP1 through a third through hole CH3 passing through the first intermediate inorganic film 10 and the second intermediate inorganic film 20. The second output electrode SE2 may be connected to the first semiconductor pattern OSP1 through a fourth through hole CH4 passing through the first intermediate inorganic film 10 and the second intermediate inorganic film 20. Meanwhile, in another embodiment, some of the first transistor T1 and the second transistor T2 may be modified into a bottom gate structure.

The intermediate organic film 30 covering the first input electrode DE1, the second input electrode DE2, the first output electrode SE1, and the second output electrode SE2 may be disposed on the second intermediate inorganic film 20. The intermediate organic film 30 may provide a flat surface.

The display element layer DP-OLED may be disposed on the intermediate organic film 30. The display element layer DP-OLED may include a pixel defining layer PDL and an organic light emitting diode OLED. The pixel defining layer PDL may comprise an organic material. A first electrode AE may be disposed on the intermediate organic film 30. The first electrode AE may be connected to the second output electrode SE2 through a fifth through hole CH5 passing through the intermediate organic film 30. An opening OP may be defined by the pixel defining layer PDL. The opening OP of the pixel defining layer PDL may extend to and expose at least a portion of the first electrode AE. As a modification, the pixel defining layer PDL may be omitted.

The pixel PX may be disposed in the display area DP-DA. The display area DP-DA may include a light emitting area PXA and a non-light emitting area NPXA adjacent to the light emitting area PXA. The non-light emitting area NPXA may surround the light emitting area PXA. The light emitting area PXA may be defined to correspond to a portion of the first electrode AE exposed by the opening OP. The non-light emitting area NPXA may be defined to correspond to the pixel defining layer PDL.

The light emitting area PXA may overlap at least one of the first and second transistors T1 and T2. The opening OP may become wider, and the first electrode AE and a light emitting layer EML described below may be widened.

A hole control layer HCL may be commonly disposed in the light emitting area PXA and the non-light emitting area NPXA. Although not separately shown, a common layer such as the hole control layer HCL may be commonly formed in the pixels PX (see FIG. 4).

The light emitting layer EML may be disposed on the hole control layer HCL. The light emitting layer EML may be disposed in a region corresponding to the opening OP. That is, the light emitting layer EML may be separately formed in each of the pixels PX. The light emitting layer EML may include an organic material and/or an inorganic material. The light emitting layer EML may generate a predetermined colored light.

Although the light emitting layer EML which is patterned may be exemplarily shown in this embodiment, the light emitting layer EML may be disposed in common to the pixels PX. At this time, the light emitting layer EML may generate white light. Further, the light emitting layer EML may have a multilayer structure called a tandem.

An electron control layer ECL may be disposed on the light emitting layer EML. Although not separately shown, the electron control layer ECL may be commonly formed in the pixels PX (see FIG. 4). A second electrode CE may be disposed on the electron control layer ECL. The second electrode CE may be commonly disposed in the pixels PX.

The thin film encapsulating layer TFE may be disposed on the second electrode CE. The thin film encapsulating layer TFE may be disposed in common to the pixels PX. In this embodiment, the thin film encapsulating layer TFE may directly cover the second electrode CE. In an embodiment, a capping layer covering the second electrode CE may be further disposed between the thin film encapsulating layer TFE and the second electrode CE. The thin film encapsulating layer TFE may then directly cover the capping layer.

In one embodiment, the organic light emitting diode OLED may further include a resonance structure for controlling a resonance distance of light generated in the light emitting layer EML. The resonance structure may be disposed between the first electrode AE and the second electrode CE, and the thickness of the resonance structure may be determined according to the wavelength of the light generated in the light emitting layer EML.

FIGS. 6A to 6D are cross-sectional views of the thin film encapsulating layer TFE according to an embodiment. Hereinafter, the description of the thin film encapsulating layer TFE with reference to FIG. 3 may be similarly applied.

Figure 6A:
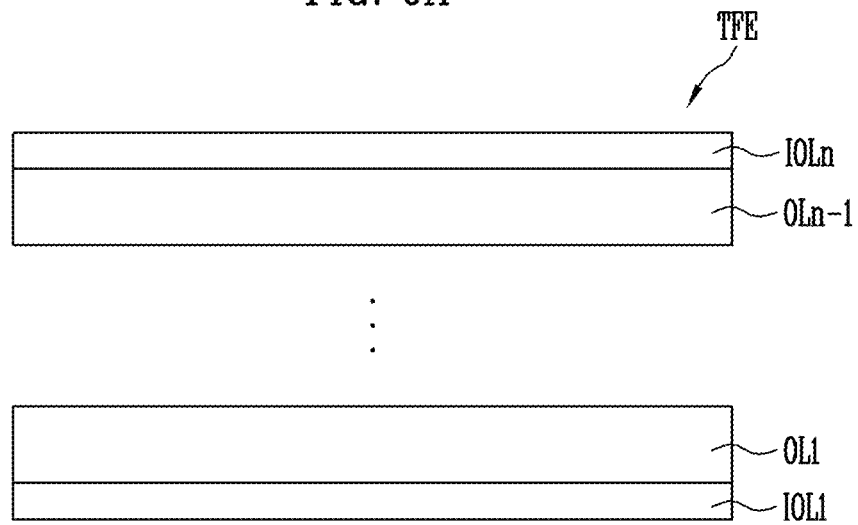
FIGS. 6A, 6B, 6C, and 6D are cross-sectional views of an exemplary embodiment of a thin film encapsulating layer.

As shown in FIG. 6A, the thin film encapsulating layer TFE according to an embodiment may include a plurality of sealing inorganic films IOL1 to IOLn, wherein n is a natural number greater than or equal to 2. The first sealing inorganic film IOL1 may contact the second electrode CE (see FIG. 5).

The thin film encapsulating layer TFE may include n−1 sealing organic films OL1. The n−1 sealing organic films OL1 may be alternately arranged with n sealing inorganic films IOL1 to IOLn. The n−1 sealing organic films OL1 may have a larger thickness than the n sealing inorganic films IOL1 to IOLn on average.

Each of the n sealing inorganic films IOL1 to IOLn may be a single layer containing one material or may have a plurality of layers each containing a different material. The n−1 sealing organic film OL1 may be formed by depositing organic monomers. For example, the organic monomers may include acrylic monomers and are not particularly limited.

In one embodiment, the thin film encapsulating layer TFE may comprise a silicon oxynitride layer, an organic monomer layer, a silicon nitride layer which are stacked in a sequential order from the second electrode CE. Another inorganic layer may be disposed on the silicon nitride layer, and the silicon nitride layer may have a plurality of layers (e.g., two layers) deposited under different conditions.

Figure 6B:
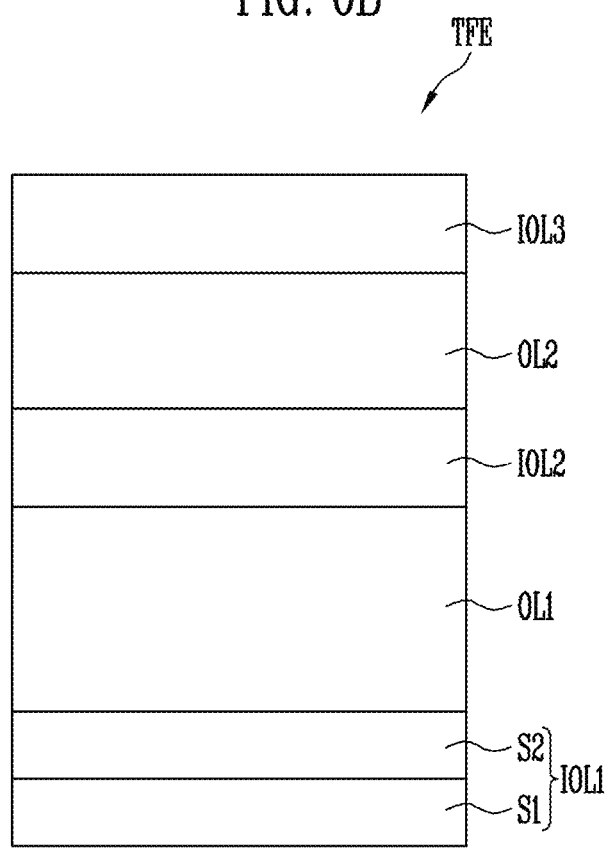

As shown in FIG. 6B, the thin film encapsulating layer TFE may be formed by sequentially laminating the first sealing inorganic film IOL1, a first sealing organic film OL1, a second sealing inorganic film IOL2, a second sealing organic film OL2, and a third sealing inorganic film IOL3.

The first sealing inorganic film IOL1 may have a two-layer structure. A first sub-layer S1 may be a lithium fluoride layer and a second sub-layer S2 may be an aluminum oxide layer. The first sealing organic film OL1 may be a first organic monomer layer, the second sealing inorganic film IOL2 may be a first silicon nitride layer, the second sealing organic film OL2 may be a second organic monomer layer, and the third inorganic film IOL3 may be a second silicon nitride layer.

Figure 6C:
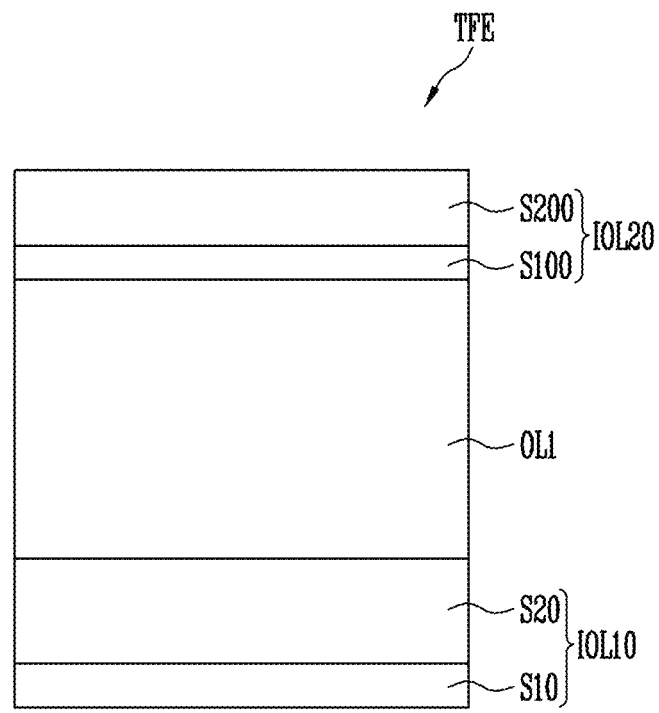

As shown in FIG. 6C, the thin film encapsulating layer TFE may include a first sealing inorganic film IOL10, the first sealing organic film OL1, and a second sealing inorganic film IOL20 which are sequentially stacked. Each of the first sealing inorganic film IOL10 and the second sealing inorganic film IOL20 may have a two-layer structure. The first sub-layer S10 may be a lithium fluoride layer and the second sub-layer S20 may be a silicon oxide layer. The second sealing inorganic film IOL20 may include a first sub-layer S100 and a second sub-layer S200 deposited in different deposition environments. The first sub-layer S100 may be deposited under low power conditions and the second sub-layer S200 may be deposited under high power conditions. Each of the first sub-layer S100 and the second sub-layer S200 may be a silicon nitride layer.

Figure 6D:
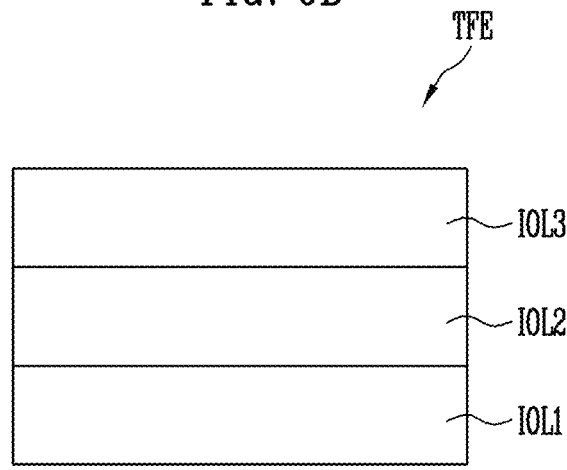

As shown in FIG. 6D, the thin film encapsulating layer TFE may include a plurality of sealing inorganic films sequentially stacked. The thin film encapsulating layer TFE may include the first sealing inorganic film IOL1, the second sealing inorganic film IOL2, and the third sealing inorganic film IOL3. At least one or more of the plurality of sealing inorganic films may include a silicon nitride layer, a silicon oxynitride layer, a silicon oxide layer, a titanium oxide layer, or an aluminum oxide layer. For example, the first sealing inorganic film IOL1 and the third sealing inorganic film IOL3 may include a silicon nitride layer, a silicon oxynitride layer, a silicon oxide layer, a titanium oxide layer, or an aluminum oxide layer.

At least one of the plurality of sealing inorganic films may be a Hexamethyldisiloxane (HMDSO) layer. The HMDSO layer may absorb stress. The second sealing inorganic film IOL2 may be the HMDSO layer. The second seal inorganic film IOL2 may absorb the stress of the first seal inorganic film IOL1 and the third seal inorganic film IOL3, so that the thin film encapsulating layer TFE may become more flexible.

When the thin film encapsulating layer TFE contains only the sealing inorganic films, continuous deposition in a single chamber may be possible, so that processes may be simplified. However, when the thin film encapsulating layer TFE comprises sealing organic films and sealing inorganic films, at least one moving process may be performed between chambers. When one of the sealing inorganic films is the HMDSO layer, the thin film encapsulating layer TFE may have flexibility.

The viewing angle/luminance ratio required in the display device DD may be kept constant by adjusting the width of a light absorbing pattern ABS according to the thickness of the thin film encapsulating layer TFE. This will be described below.

FIG. 7 is a cross-sectional view of a display device DD according to an embodiment. In FIG. 7, the display panel DP may be simplified to illustrate the stacking relationship of the input sensing unit ISU. The reflection preventing unit and the window unit which may be disposed on the input sensing unit ISU are not shown in FIG. 7.

In the present embodiment, the input sensing unit ISU which corresponds to the input sensing "layer" ISL as described with reference to FIG. 2 is exemplarily described. This "layer" type input sensing unit ISU may be disposed directly on the base surface provided by the display panel DP. In other words, the base layer may be omitted, so that the thickness of the display module DM may be reduced in comparison with the "panel" type input sensing unit ISU. In this embodiment, the base surface may be an upper surface of the thin film encapsulating layer TFE.

The input sensing unit ISU may have a multilayer structure regardless of whether the input sensing unit ISU corresponds to the input sensing panel or the input sensing layer. The input sensing unit ISU may include a sensing electrode, a signal line coupled to the sensing electrode, and at least one insulating layer. The input sensing unit ISU may sense an external input, for example, in a capacitive manner. The method of operating the input sensing unit ISU in the present embodiment is not particularly limited. In an embodiment, the input sensing unit ISU may sense an external input by electromagnetic induction or pressure sensing.

Referring to FIG. 7, the input sensing unit ISU according to an embodiment may include a first conductive layer IS-CL1, a first insulating layer IS-IL1, a second conductive layer IS-CL2, and a second insulating layer IS-IL2. Each of the first conductive layer IS-CL1 and the second conductive layer IS-CL2 may have a single layer structure or a multi-layer structure including layers stacked along the third direction axis DR3. The single-layered conductive layer may include a metal layer or a transparent conductive layer. The metal layer may comprise molybdenum, silver, titanium, copper, aluminum, and alloys thereof. The transparent conductive layer may include a transparent conductive oxide such as indium tin oxide (ITO), indium zinc oxide (IZO), zinc oxide (ZnO), and indium tin zinc oxide (ITZO). In addition, the transparent conductive layer may include a conductive polymer such as PEDOT, metal nanowires, graphene, and the like.

The multilayered conductive layer may comprise a plurality of metal layers. The plurality of metal layers may have a three-layer structure, for example, titanium/aluminum/titanium. The multilayered conductive layer may include at least one metal layer and at least one transparent conductive layer.

Each of the first conductive layer IS-CL1 and the second conductive layer IS-CL2 may include a plurality of patterns. Hereinafter, the first conductive layer IS-CL1 may include first conductive patterns, and the second conductive layer IS-CL2 may include second conductive patterns. Each of the first conductive patterns and the second conductive patterns may include sensing electrodes and signal lines.

A lamination structure and material of the sensing electrodes may be determined in consideration of sensing sensitivity. RC delay may affect the sensing sensitivity. Since the sensing electrodes including a metal layer have a smaller resistance than a transparent conductive layer, an RC value may decrease. As a result, a charging time of a capacitor defined between the sensing electrodes may decrease. The sensing electrodes including the transparent conductive layer may not be visually recognized by the user in comparison with the metal layer, and an input area may be increased to increase capacitance.

The sensing electrodes including the metal layer may have a mesh shape, as described below, to prevent the user from viewing the sensing electrodes.

On the other hand, the thickness of the thin film encapsulating layer TFE may be adjusted so that noise generated by the elements of the display element layer DP-OLED may not affect the input sensing unit ISU. Each of the first insulating layer IS-IL1 and the second insulating layer IS-IL2 may have a single-layer or multilayer structure. Each of the first insulating layer IS-IL1 and the second insulating layer IS-IL2 may include an inorganic material, an organic material, or a composite material.

At least one of the first insulating layer IS-IL1 and the second insulating layer IS-IL2 may include an inorganic film. The inorganic film may comprise at least one of aluminum oxide, titanium oxide, silicon oxide, silicon oxynitride, zirconium oxide, and hafnium oxide.

At least one of the first insulating layer IS-IL1 and the second insulating layer IS-IL2 may include an organic layer. The organic film may be formed of at least one of acrylic resin, methacrylic resin, polyisoprene, vinyl resin, epoxy resin, urethane resin, cellulose resin, siloxane resin, polyimide resin, polyamide resin and perylene resin.

Figure 10:
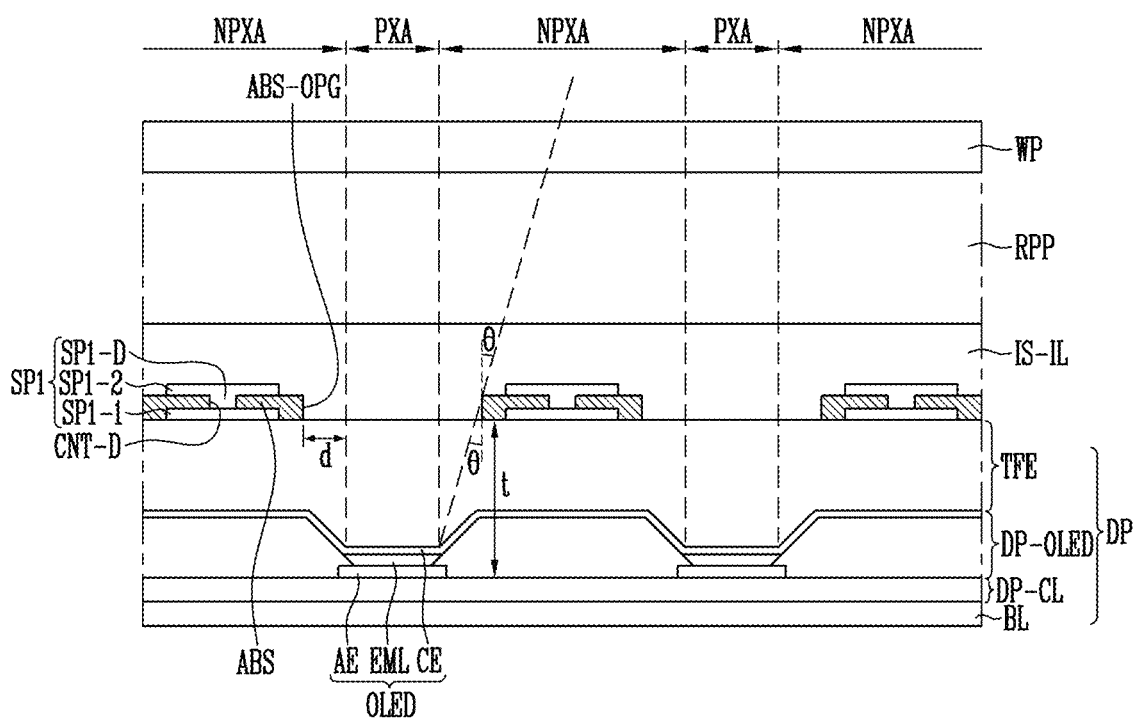
FIG. 10 is a cross-sectional view of the display device taken along line VIII-VIII' of FIG. 9.

Although not shown in FIG. 7, the input sensing unit ISU may include a light absorbing pattern ABS (see FIG. 10). The light absorbing pattern ABS may have an aperture ABS-OPG for exposing a light emitting area, and may be disposed so as to overlap with a non-light emitting area. The light absorbing pattern ABS may suppress the reflection of external light incident on the display device DD. This will be described below.

The input sensing unit ISU may have a base corresponding to the display panel DP. In other words, the base may be a surface facing the display panel DP. Each of the light emitting areas and the non-light emitting areas of the display panel DP may correspond to a light transmitting area and a non-light transmitting area of the base of the input sensing unit ISU. The light emitting area and the non-light emitting area may be used in the same manner as the light transmitting area and the non-light transmitting area, respectively.

A light path changing portion LNS (see FIG. 15) may be provided between the first insulating layer IS-IL1 and the second insulating layer IS-IL2. The light path changing portion LNS at an interface between the first insulating layer IS-IL1 and the second insulating layer IS-IL2 may protrude toward the display element layer DP-OLED, or may protrude toward an outside of the display device DD to face the display element layer DP-OLED. As an example, the light path changing portion LNS may be in the shape of a concave or convex lens toward the display element layer DP-OLED. The light path changing unit LNS may change a path of light directed to the light path changing unit LNS to condense or scatter the light. Accordingly, the luminance at the front face of the display device DD may be increased or white angular dependency (WAD) may be improved. This will be described below.

Figure 8:
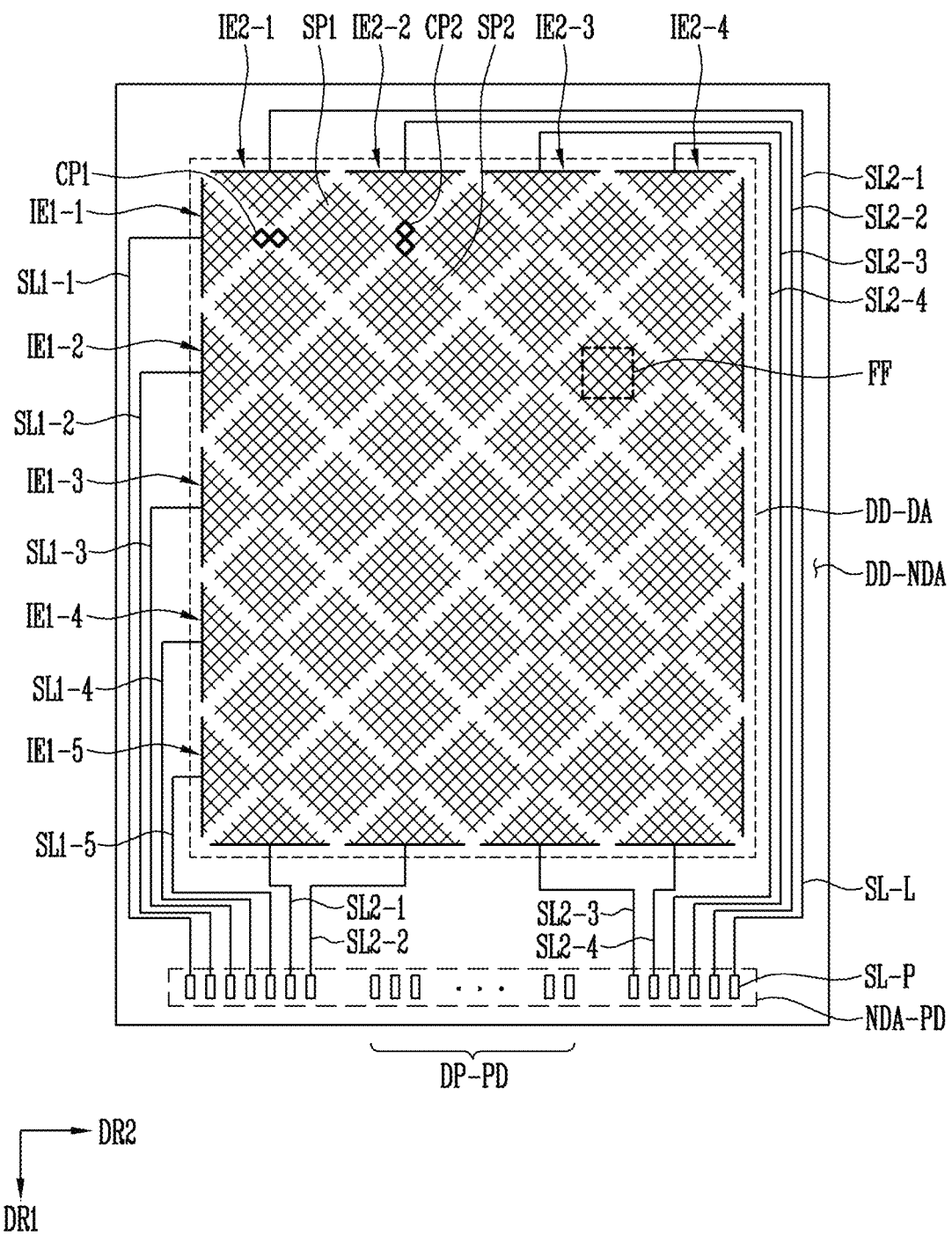
FIG. 8 is a plan view illustrating an exemplary embodiment of an input sensing unit.
Figure 9:
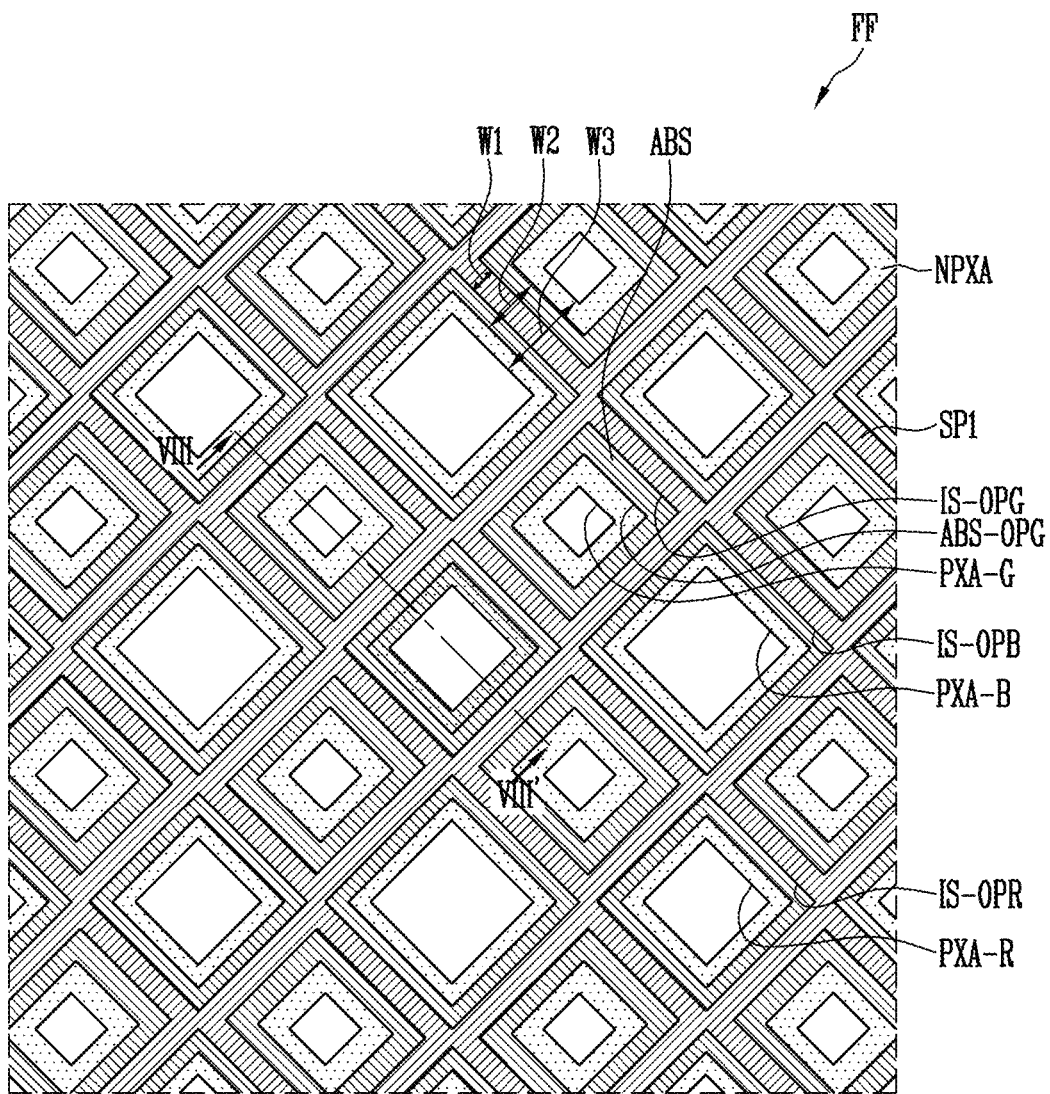
FIG. 9 is an enlarged view of a region FF of the input sensing unit shown in FIG. 8.

FIG. 8 is a plan view of the input sensing unit ISU according to an embodiment. FIG. 9 is an enlarged view of a region FF of the input sensing unit ISU shown in FIG. 8. FIG. 10 is a cross-sectional view of the display device taken along line VIII-VIII' of FIG. 9. Hereinafter, a detailed description of the same configuration as that of the display device DD described with reference to FIGS. 1 to 7 will be omitted. Hereinafter, the circuit element layer DP-CL is schematically shown.

Referring to FIG. 8, the input sensing unit ISU according to an embodiment may include first sensing electrodes IE1-1 to IE1-5 and second sensing electrodes IE2-1 to IE2-4.

A plurality of first sensing portions SP1 may be arranged along the second direction axis DR2 in one first sensing electrode and a plurality of second sensing portions SP2 may be arranged in the first direction axis DR1 in one second sensing electrode. Each of a plurality of first connecting portions CP1 may connect adjacent first sensing portions SP1 and each of a plurality of second connecting portions CP2 may connect adjacent second sensing portions SP2.

The first sensing electrodes IE1-1 to IE1-5 and the second sensing electrodes IE2-1 to IE2-4 may have a mesh pattern. The mesh pattern may comprise a mesh line which is a metal line forming one or more mesh holes IS-OPR, IS-OPG, and IS-OPB (see FIG. 9).

Since the first sensing electrodes IE1-1 to IE1-5 and the second sensing electrodes IE2-1 to IE2-4 have the mesh pattern, a parasitic capacitance generated between the first and second sensing electrodes IE1-1 to IE1-5 and IE2-1 to IE2-4 and the electrodes of the display panel DP as shown in FIG. 7 may be reduced.

As described below, since the first sensing electrodes IE1-1 to IE1-5 and the second sensing electrodes IE2-1 to IE2-4 do not overlap the light emitting areas PXA-R, PXA-G, and PXA-B, the first sensing electrodes IE1-1 to IE1-5 and the second sensing electrodes IE2-1 to IE2-4 may not be visible to the user of the display device DD.

The first sensing electrodes IE1-1 to IE1-5 and the second sensing electrodes IE2-1 to IE2-4 having the mesh pattern may be formed of silver, aluminum, copper, chromium, nickel, or titanium which allows a low-temperature process. But the embodiments are not limited thereto. Damage of the organic light emitting diodes as shown in FIG. 5 may be prevented even when the input sensing unit ISU is formed by a continuous process.

When the first sensing electrodes IE1-1 to IE1-5 and the second sensing electrodes IE2-1 to IE2-4 having the mesh pattern are disposed directly on the display panel DP, the flexibility of the display device DD may be improved.

The first sensing electrodes IE1-1 to IE1-5 and the second sensing electrodes IE2-1 to IE2-4 shown in FIG. 8 may include the diamond-shaped first and second sensing portions SP1 and SP2. However, the embodiments are not limited thereto. The first sensing portions SP1 and the second sensing portions SP2 may have various polygonal shapes. For example, the first sensing electrodes IE1-1 to IE1-5 and the second sensing electrodes IE2-1 to IE2-4 may have a bar shape so that the sensing portions and the connecting portions thereof may not be divided from each other.

First signal lines SL1-1 to SL1-5 may be connected to respective ends of the first sensing electrodes IE1-1 to IE1-5. Each of second signal lines SL2-1 to SL2-4 may be connected to both ends of each of the second sensing electrodes IE2-1 to IE2-4. In one embodiment, each of the first signal lines SL1-1 to SL1-5 may also be connected to both ends of each of the first sensing electrodes IE1-1 to IE1-5. However, in an embodiment, each of the second signal lines SL2-1 to SL2-4 may be connected to only one end of each of the second sensing electrodes IE2-1 to IE2-4.

The sensing sensitivity of the input sensing unit ISU according to the present embodiment may be improved in comparison with the input sensing unit ISU including the second signal lines SL2-1 to SL2-4 each of which is connected to only one end of each of the second sensing electrodes IE2-1 to IE2-4, and the sensing sensitivity of the present embodiment may be improved. Since the second sensing electrodes IE2-1 to IE2-4 may be longer than the first sensing electrodes IE1-1 to IE1-5, a voltage drop of a detection signal (or a transmission signal) may occur to lower sensing sensitivity. According to the present embodiment, since the detection signal (or the transmission signal) may be provided through the second signal lines SL2-1 to SL2-4 each connected to both ends of each of the second sensing electrodes IE2-1 to IE2-4, the voltage drop of the detection signal (or the transmission signal) may be prevented to avoid decrease in sensing sensitivity.

The first signal lines SL1-1 to SL1-5 may be disposed on the left side, and the second signal lines SL2-1 to SL2-4 may be disposed on the right side. The positions of the first signal lines SL1-1 to SL1-5 and the second signal lines SL2-1 to SL2-4 may be mutually changed. Unlike FIG. 8, the first signal lines SL1-1 to SL1-5 may be disposed on the right side, and the second signal lines SL2-1 to SL2-4 may be disposed on the left side.

The first signal lines SL1-1 to SL1-5 and the second signal lines SL2-1 to SL2-4 may include a line portion SL-L and a pad portion SL-P. The pad portions SL-P may be aligned in the pad area NDA-PD. The pad portions SL-P may overlap the dummy pads IS-DPD shown in FIG. 4.

The input sensing unit ISU may include the signal pads DP-PD. The signal pads DP-PD may be aligned in the pad areas NDA-PD.

In an embodiment, the first signal lines SL1-1 to SL1-5 and the second signal lines SL2-1 to SL2-4 may be replaced by a circuit board to be manufactured and coupled separately.

FIG. 9 is an enlarged view of the region FF of the input sensing unit ISU shown in FIG. 8. Referring to FIG. 9, the first sensing portions SP1 may overlap the light absorbing patterns ABS and may not overlap the light emitting areas PXA-R, PXA-G, and PXA-B. The light absorbing patterns ABS may overlap the non-light emitting area NPXA. Each of the light emitting areas PXA-R, PXA-G, and PXA-B may be defined in the same manner as the light emitting area PXA shown in FIG. 5.

Mesh lines (metal lines) of the first sensing portions SP1 may define the plurality of mesh holes IS-OPR, IS-OPG, and IS-OPB. Each of the plurality of mesh holes IS-OPR, IS-OPG, and IS-OPB may correspond to each of the light emitting areas PXA-R, PXA-G, and PXA-B and the light absorbing patterns ABS. In other words, the light emitting areas PXA-R, PXA-G, and PXA-B may be exposed by the aperture ABS-OPG of the light absorbing pattern ABS. The aperture ABS-OPG of the light absorbing pattern ABS and the light emitting areas PXA-R, PXA-G, and PXA-B may be exposed by the mesh holes IS-OPR, IS-OPG, and IS-OPB.

When the display device is viewed in a plan view, the aperture ABS-OPG of the light absorbing pattern ABS may be formed so as to overlap the light emitting areas PXA-R, PXA-G, and PXA-B. The mesh holes IS-OPR, IS-OPG, and IS-OPB may be formed so as to overlap the light emitting areas PXA-R, PXA-G, and PXA-B and the aperture ABS-OPG of the light absorbing pattern ABS in a plan view.

A line width W1 of the mesh line may be smaller than a width W2 of the light absorbing pattern ABS. The width W2 of the light absorbing pattern ABS may be smaller than a width W3 of the pixel defining layer PDL corresponding to the non-light emitting area NPXA.

The light absorbing pattern ABS and the mesh lines may be formed on the non-light emitting area NPXA and may not invade the light emitting areas PXA-R, PXA-G, and PXA-B. Therefore, the light absorbing pattern ABS and the mesh lines may be prevented from blocking light emitted from the light emitting areas PXA-R, PXA-G, and PXA-B, and the light absorbing pattern ABS and the mesh lines may not be visible to the user.

The mesh lines may have a three-layer structure of titanium/aluminum/titanium as an example.

The light emitting areas PXA-R, PXA-G, and PXA-B may be divided into a plurality of groups according to the color of light generated in the organic light emitting diodes OLED. Referring to FIG. 9, the light emitting areas PXA-R, PXA-G, and PXA-B may be divided into three groups according to light emission colors.

The light emitting areas PXA-R, PXA-G, and PXA-B may have different areas depending on the color emitted from the light emitting layer EML of the organic light emitting diode OLED. The areas of the light emitting areas PXA-R, PXA-G, and PXA-B may be determined depending on the type of the organic light emitting diode OLED.

The mesh holes IS-OPR, IS-OPG, and IS-OPB may be divided into a plurality of groups having different areas. The mesh holes IS-OPR, IS-OPG and IS-OPB may be divided into three groups according to the corresponding light emitting areas PXA-R, PXA-G and PXA-B.

As shown in FIG. 9, each of the mesh holes IS-OPR, IS-OPG and IS-OPB may correspond to each of the light emitting areas PXA-R, PXA-G and PXA-B, but the embodiments are not limited thereto. Each of the mesh holes IS-OPR, IS-OPG and IS-OPB may correspond to two or more light emitting areas PXA-R, PXA-G and PXA-B. The mesh lines forming the mesh holes IS-OPR, IS-OPG and IS-OPB may correspond to the light absorbing pattern ABS formed on the non-light emitting area NPXA.

The light emitting areas PXA-R, PXA-G, and PXA-B may be different areas from each other as shown in FIG. 9. However, the embodiments are not limited thereto. The light emitting areas PXA-R, PXA-G and PXA-B may have the same size, and the mesh holes IS-OPR, IS-OPG and IS-OPB may have the same size. The mesh holes IS-OPR, IS-OPG, and IS-OPB may have a rhombic shape. However, the embodiments are not limited thereto, and the mesh holes IS-OPR, IS-OPG, and IS-OPB may be various polygonal shapes. The mesh holes IS-OPR, IS-OPG and IS-OPB may have polygonal shapes with rounded corners.

FIG. 10 is a cross-sectional view of the display device according to VIII-VIII' of FIG. 9. Referring to FIG. 10, the first sensing portion SP1 of each of the first sensing electrodes IE1-1 to IE1-5 may include a first mesh pattern SP1-1 and a second mesh pattern SP1-2. Each of the first mesh pattern SP1-1 and the second mesh pattern SP1-2 may include metal formed in a mesh shape. That is, the second mesh pattern SP1-2 may be located on the first mesh pattern SP1-1 and the light absorbing pattern ABS may be interposed between the first mesh pattern SP1-1 and the second mesh pattern SP1-2. At least one connection contact hole CNT-D may be formed in the light absorbing pattern ABS and a contact portion SP1-D may electrically connect the second mesh pattern SP1-2 and the first mesh pattern SP1-1 through the connection contact hole CNT-D.

The first mesh pattern SP1-1 may be formed on the thin film encapsulating layer TFE so as to correspond to the pixel defining layer PDL which is located in the non-light emitting area NPXA. The light absorbing pattern ABS may be formed to overlap the first mesh pattern SP1-1. The light absorbing pattern ABS may have the aperture ABS-OPG overlapping the light emitting area PXA. The light absorbing pattern ABS may correspond to the pixel defining layer PDL which is located in the non-light emitting area NPXA in the same manner as the first mesh pattern SP1-1. The second mesh pattern SP1-2 may be formed on the light absorbing pattern ABS. The width of the second mesh pattern SP1-2 may be less than or equal to the width W2 of the light absorbing pattern ABS.

The light absorbing pattern ABS may have the connection contact hole CNT-D penetrating from one surface thereof to the other surface opposite to the one surface. The connection contact hole CNT-D may penetrate the light absorbing pattern ABS in the direction toward the pixel defining layer PDL. The contact unit SP1-D may electrically connect the first mesh pattern SP1-1 and the second mesh pattern SP1-2 through the connection contact hole CNT-D. The contact portion SP1-D may be formed of a conductive material. As an example, the contact portion SP1-D may be formed of the same material as the first mesh pattern SP1-1 or the second mesh pattern SP1-2 for processing convenience. As another example, the contact portion SP1-D may be formed of a material having a higher electric conductivity than the first mesh pattern SP1-1 or the second mesh pattern SP1-2.

The second sensing portion SP2 of each of the second sensing electrodes IE2-1 to IE2-4 may have a two-layer mesh pattern like the first sensing portion SP1 of each of the first sensing electrodes IE1-1 to IE1-4. The light absorbing pattern ABS may be disposed between the two layers of the mesh pattern. The two-layer mesh pattern may be electrically connected by the contact portion through the connection contact hole CNT-D formed in the light absorbing pattern ABS.

Since the sensing electrode has the first mesh pattern and the second mesh pattern and the first mesh pattern and the second mesh pattern is electrically connected to each other, the resistance of the sensing electrode may be lowered to thereby improve the RC delay.

The light absorbing pattern ABS may include a material capable of blocking light. For example, the light absorbing pattern ABS may include an organic material having high light absorption. The light absorbing pattern ABS may comprise a black pigment or a black dye. The light absorbing pattern ABS may comprise a photosensitive organic material and may comprise, for example, a colorant such as a pigment or a dye. The light absorbing pattern ABS may have a single-layer structure or a multi-layer structure.

The reflective color of the display device DD may be improved by blocking the reflection of the external light in the light absorbing pattern ABS.

More specifically, when external light is incident on the display device DD, the light may be reflected in the display device DD. For example, the external light may be reflected from the TFT or the electrode in the display panel DP and then emitted to the outside of the display device DD. When the external light is reflected in the display device DD and then emitted to the outside of the display device DD, the color expressed by the display device DD may be distorted due to the reflection of external light. That is, the reflective color characteristic may be deteriorated. In addition, the external light reflection may make it difficult to display a real back color and result in poor outdoor visibility.

The reflection preventing panel RPP may prevent external light incident into the display device DD from being reflected in the display device DD and being emitted to the outside. However, due to structural characteristics of the organic light emitting display, the reflection preventing panel RPP alone may be limited in preventing the reflection of external light.

In other words, the organic light emitting display panel may be more vulnerable to external light reflection than the LCD display panel. More specifically, the LCD display panel may shield external light reflected by the liquid crystal layer. However, since the organic light emitting display panel is a self-luminous display, there may be no separate liquid crystal layer. Thus, the organic light emitting display panel may be structurally vulnerable to outdoor light reflection. Although the reflection preventing panel RPP may be provided on the organic light emitting display panel to reduce external light reflection, the organic light emitting display panel having the reflection preventing panel RPP may be relatively inferior to the LCD display panel having the liquid crystal layer in terms of suppressing the reflection of external light. In addition, it may be difficult for the organic light emitting display panel to realize real black due to the degraded characteristics of reflective color.

The display device DD according to an embodiment may include the light absorbing pattern ABS to prevent the reflection of external light, thereby improving the characteristics of reflective color of the display device DD and improving outdoor visibility. That is, the light absorbing pattern ABS may be disposed on the non-light emitting area NPXA of the display device DD and may absorb the light reflected by the TFT or the electrode in the display panel DP and directed to the non-light emitting area NPXA. Thus, the light absorbing pattern ABS may prevent external light incident into the display device DD from being released again to the outside of the display device DD. In addition, since the aperture ABS-OPG exposes the light emitting area PXA, the reduction in the luminance may be avoided and the characteristics of reflective color may be improved.

Figure 11A:
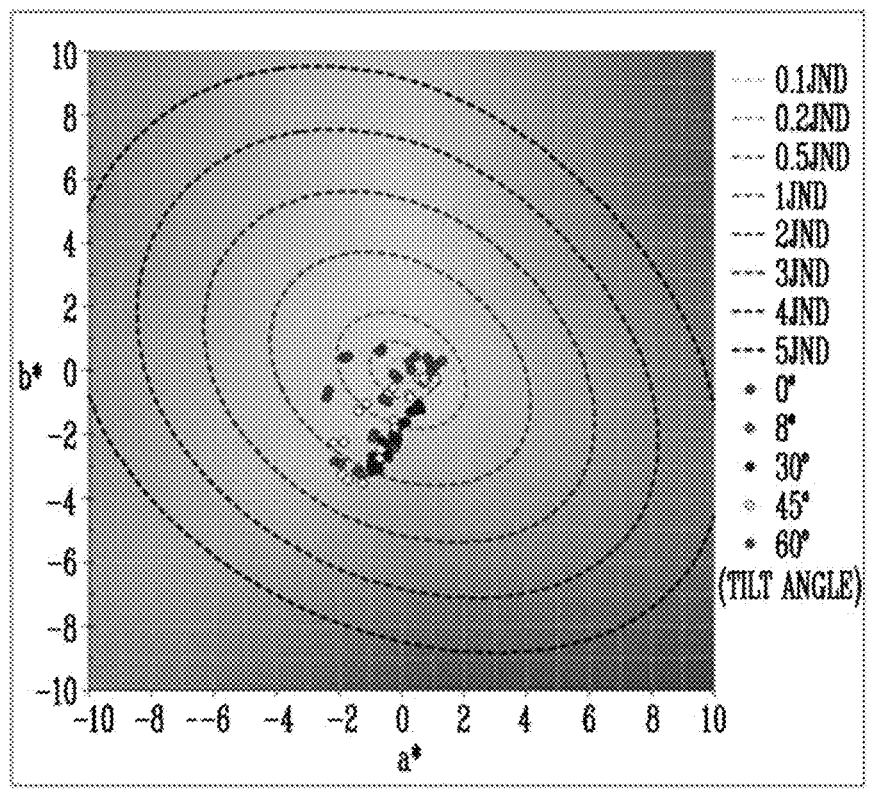
FIG. 11A is a color coordinate diagram illustrating a distribution a*b* for each of the tilt angles and azimuth angles measured by the Specular component excluded (SCE) in a conventional display device.
Figure 11B:
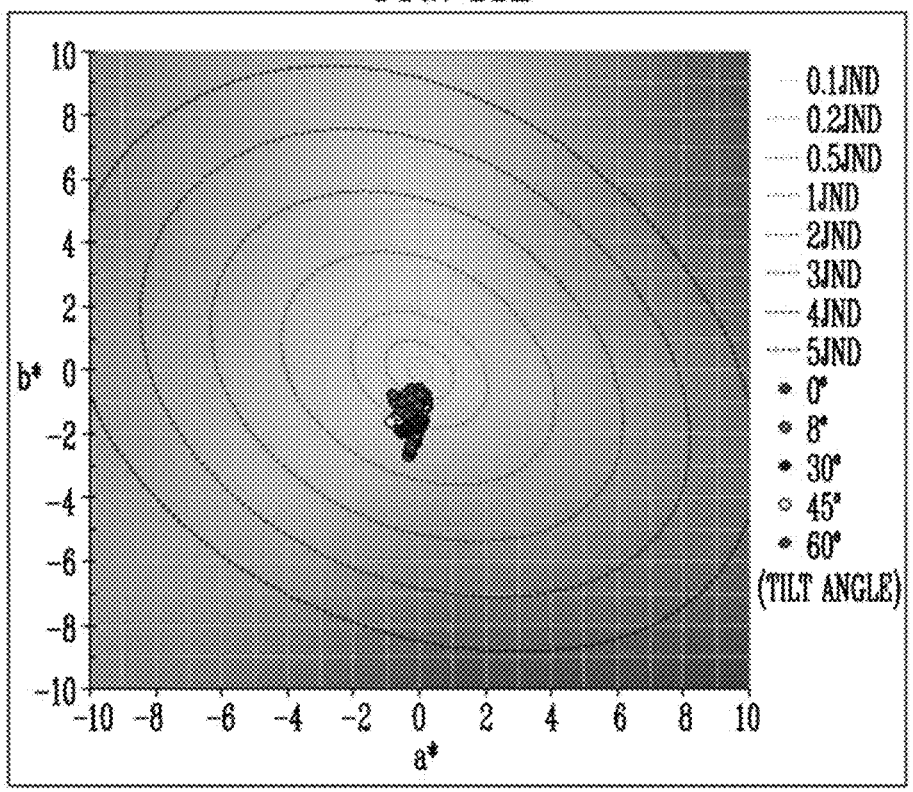
FIG. 11B is a color coordinate diagram illustrating a distribution a*b* for each of the tilt angles and the azimuth angles measured by the SCE in an exemplary embodiment of a display device.

Improvement of characteristics of reflective color by the light absorbing pattern ABS may be shown in FIGS. 11A and 11B.

FIG. 11A is a color coordinate diagram showing an a*b* distribution by a tilt angle and an azimuth angle measured with specular component excluded (SCE) in a conventional display device, and FIG. 11B is a color coordinate diagram showing an a*b* distribution by a tilt angle and an azimuth angle measured with the SCE in one embodiment.

Methods for measuring reflected light may include specular component included (SCI) including specular reflectance and specular component excluded (SCE) excluding specular reflectance. In SCE mode, the specular reflectance may be removed, so that only diffuse reflectance may be measured. In SCI mode, both the diffuse reflectance and the specular reflectance may be measured and the total reflectance may be measured regardless of surface conditions.

In general, people ignore such specular reflectance and recognize color. Therefore, when measuring color as if people see it, only diffuse reflectance, except specular reflection, may be measured. Generally, the reflective color of the display device may be measured in SCE mode.

Figure 11C:
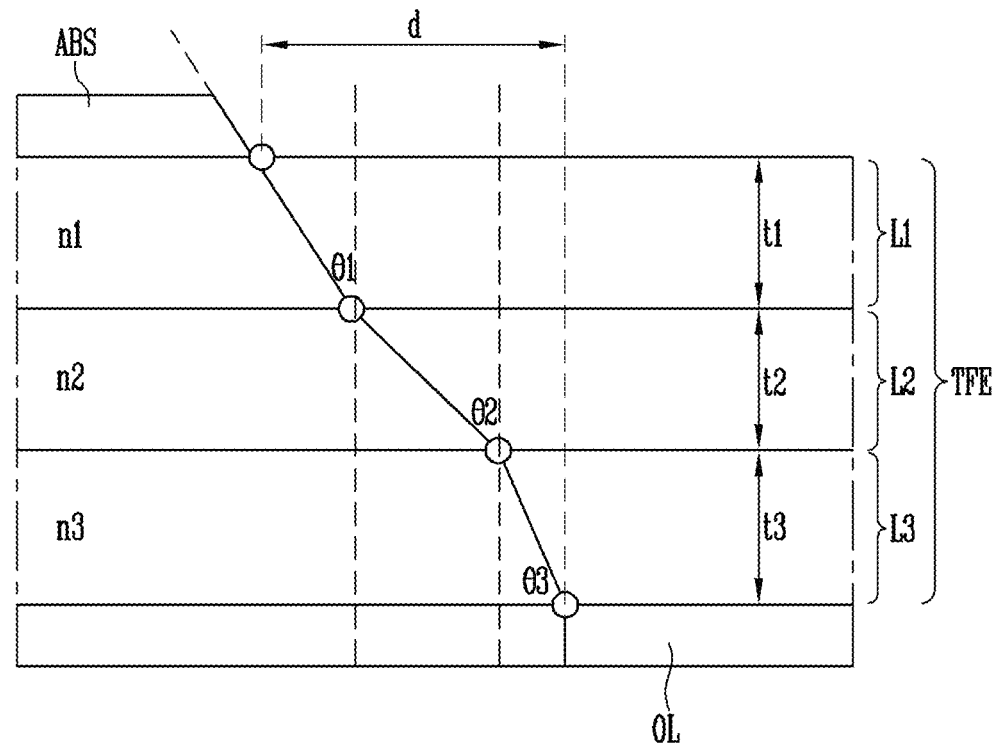
FIG. 11C is a cross-sectional view illustrating a thin film encapsulation which is formed of three layers.

FIGS. 11A and 11B illustrate color coordinates showing the a*b* distribution for each of the tilt angles and azimuth angles measured in SCE mode. FIG. 11C is a cross-sectional view illustrating a thin film encapsulation TFE which is formed of three layers L1, L2, and L2. FIG. 11A is a color coordinate diagram showing the a*b* distribution according to each tilt angle and each azimuth angle measured in SCE mode with respect to a conventional display device without a light absorbing pattern. FIG. 11B is the color coordinate diagram showing the a*b* distribution by each tilt angle and azimuth angle measured in SCE mode with respect to the display device including the light absorbing pattern ABS.

In SCE mode, light reflected from the display device may be measured at tilt angles of 0°, 8°, 30°, 45°, and 60° with respect to the normal to the plane of a measurement subject, i.e., the display device while rotating the display device by 360°.

The measured values may be displayed in an International Commission on Illumination (CIE) L*a*b* color space.

In the CIE L*a*b* color space, the L* value may represent lightness. L*=0 may indicate black, and L*=100 may indicate white. The a* value may indicate the red/green scale. If the a* value is negative, a color is closer to green. If the a* value is positive, it may be closer to red or violet. The b* value represents the yellow/blue scale. If the b* value is negative, a color may be closer to blue. If the b* value is positive, it may be closer to yellow.

The larger the L* value, the a* value, and the b* value are from zero, the more color distortion may occur. It may be said that the reflective color is weak.

FIG. 11A shows the result of measurement on the organic light emitting diode OLED which does not have the light absorbing pattern ABS. Referring to FIG. 11A, the values of a* and b* were measured as negative values at 0° and 8° as well as at 45° and 60°, and the values of a* and b* are widely distributed. This may mean that the characteristics of reflective color of the display device are low, and real black is not realized. In particular, the b* value may be skewed to −4, which means that black with blue may be realized. Also, since the a* and b* values are widely distributed, the color may be recognized differently depending on the tilt angle and the azimuth angle at which the display device is viewed.

On the other hand, FIG. 11B shows the result of measurement on the organic light emitting diode OLED having the light absorbing pattern ABS. Referring to FIG. 11B, it may be seen that the spread of a* and b* is lower and the values of a* and b* do not deviate much from zero as compared with those of FIG. 11A. That is, the lower spread of a* and b* may mean that the difference in color depending on the tilt angle or the azimuth angle at the display device is viewed is not large, and a* and b* values closer to zero may mean that the display device reproduced the color closer to real black.

As shown in FIGS. 11A and 11B, the display device DD according to an embodiment may include the light absorbing pattern ABS to improve the characteristics of reflective color of the display device DD and to manufacture products which realize real black.

The display device DD according to an embodiment may include the light absorbing pattern ABS. As described above, reflection of external light may be prevented to improve the characteristics of reflective color. However, the light absorbing pattern ABS may absorb not only external light but also light emitted from the light emitting element. Accordingly, light extraction efficiency may decrease due to the light absorbing pattern ABS applied to improve the reflective color.

According to an embodiment, the viewing angle/luminance ratio required in the display device DD may be kept constant by adjusting the width of the light absorbing pattern ABS. The width of the light absorbing pattern ABS may be varied in accordance with the distance between the boundary of the aperture ABS-OPG of the light absorbing pattern ABS and the outer boundary of the light emitting area PXA, in a plan view of the display device DD. The viewing angle/luminance ratio of the display device DD may be kept constant by adjusting the distance between the boundary of the aperture ABS-OPG of the light absorbing pattern ABS and the outer boundary of the light emitting area PXA in accordance with the thickness of the thin film encapsulating layer TFE.

In order to maintain a constant ratio of the viewing angle/luminance ratio, that is, the ratio of the luminance value to a reference value at a predetermined viewing angle, the following Equation 1 may be satisfied:

$$d = t \times \tan \theta \quad \text{(Equation 1)}$$

In Equation 1, d may be the distance between the boundary of the aperture ABS-OPG of the light absorbing pattern ABS and the outer boundary of the light emitting area PXA, t may be the thickness of the thin film encapsulating layer TFE, and Θ may be the tilt angle with respect to the surface of the display device for measuring the viewing angle/luminance ratio.

The display device DD may require luminance value of a predetermined level or more at a specific viewing angle. For example, in an organic light emitting display device, when a luminance value of when a tilt angle is perpendicular to the plane of the organic light emitting display device, that is, a luminance value at a tilt angle of 0° is set as a reference value, a luminance value at a tilt angle of 45° may satisfy 45% or more of the reference value.

In order to obtain the luminance value at the tilt angle of 45° which is 45% with respect to the reference value, the distance d between the boundary of the aperture ABS-OPG of the light absorbing pattern ABS and the outer boundary of the light emitting area PXA may satisfy d=t*tan 45° according to Equation 1. The distance d may be determined according to the thickness of the thin film encapsulating layer TFE.

The distance d between the boundary of the aperture ABS-OPG of the light absorbing pattern ABS and the outer boundary of the light emitting area PXA may be proportional to the thickness t of the thin film encapsulating layer TFE. Therefore, when the thickness t of the thin film encapsulating layer TFE is increased, the size of the aperture ABS-OPG of the light absorbing pattern ABS may be adjusted so that the distance d may be increased. When the thickness t of the thin film encapsulating layer TFE is decreased, the size of the aperture ABS-OPG of the light absorbing pattern ABS may be adjusted so that the distance d may be reduced.

When the distance d between the boundary of the aperture ABS-OPG of the light absorbing pattern ABS and the outer boundary of the light emitting area PXA is increased, the width W2 of the light absorbing pattern ABS may be reduced. On the other hand, when the distance d between the boundary of the aperture ABS-OPG of the light absorbing pattern ABS and the outer boundary of the light emitting area PXA is reduced, the width W2 of the light absorbing pattern ABS may be increased.

When the distance d is increased, the width W2 of the light absorbing pattern ABS may be reduced, so that the absorption of external light may be relatively weakened. As a result, the characteristics of reflective color may be weakened. Also, since the width of the pattern line of the sensing electrode formed on the light absorbing pattern ABS is reduced, the resistance may be increased and RC delay may occur.

On the other hand, when the distance d is decreased, the width W2 of the light absorbing pattern ABS may be increased, so that the absorption of external light may be relatively increased. Thus, the characteristics of reflective color may be improved. However, since the light emitted from the light emitting element is also absorbed by the light absorbing pattern ABS, the viewing angle/luminance ratio may be lowered.

When the size of the light absorbing pattern ABS is determined according to Equation 1, the characteristics of reflective color may be improved, and the viewing angle/luminance ratio may be maintained at a predetermined level.

According to another embodiment, referring to FIG. 11C, when the thin film encapsulating layer TFE is formed of three layers L1, L2, and L3, the distance d between the boundary of the aperture ABS-OPG and the outside boundary of the light emitting area PXA may be determined by the following Equation 2:

$$d = t_1 \tan\left(\frac{1}{n_1}\sin\left(D\frac{\Pi}{180°}\right)\right) + t_2 \tan\left(\frac{1}{n_2}\sin\left(D\frac{\Pi}{180°}\right)\right) + t_3 \tan\left(\frac{1}{n_3}\sin\left(D\frac{\Pi}{180°}\right)\right).$$ (Equation 2)

In Equation 2, t1, t2 and t3 may be the thicknesses of the layers L1, L2 and L3 of the thin film encapsulating layer TFE, respectively, and n1, n2 and n3 may be the refractive indices of the layers L1, L2 and L3, respectively. In addition, D may be the tilt angle of the display device with respect to the plane for measuring the viewing angle/luminance ratio. For example, D may be 0°, 45°, and 60°

More generally, when the thin encapsulating layer TFE comprises k layers, the distance d between the boundary of the aperture ABS-OPG and the outside boundary of the light emitting area PXA may be determined by the following Equation 3:

$$d = \sum_{i=1}^{k} t_i \tan\left(\frac{1}{n_i}\sin\left(D\frac{\Pi}{180°}\right)\right).$$ (Equation 3)

In Equation 3, $t_i$ may be the thickness of the i-layer of the thin film encapsulating layer TFE including the k layers, and $n_i$ may be the refractive index of the i-layer.

Figure 12:
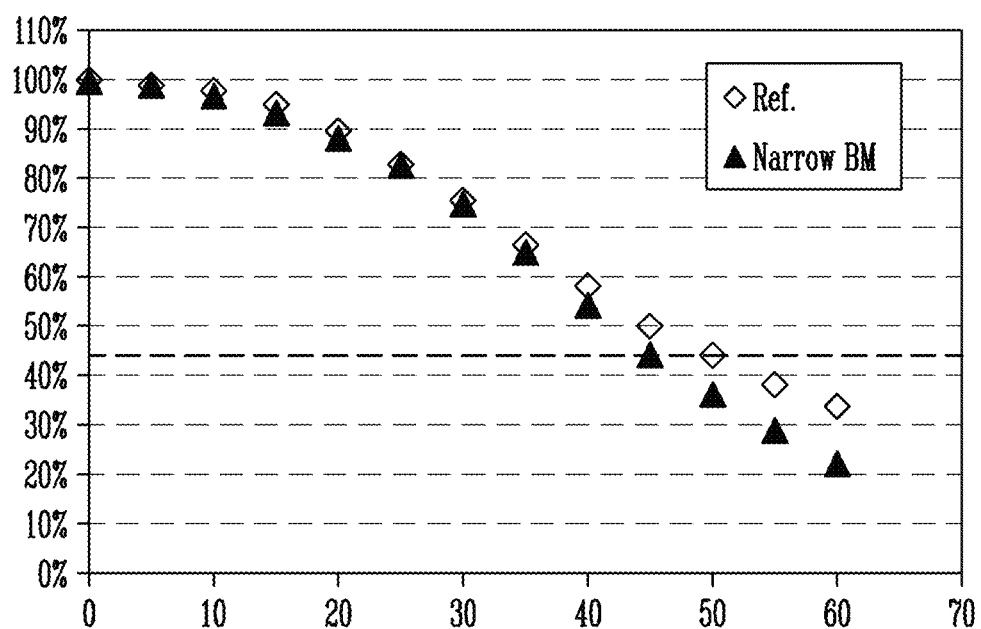
FIG. 12 is a graph illustrating a luminance ratio of a conventional display device and a display device according to an embodiment, according to viewing angles.

FIG. 12 is a graph showing a luminance ratio according to the viewing angle of each of a conventional display device and the display device according to an embodiment.

Referring to FIG. 12, the Ref value may represent the luminance ratio of the organic light emitting display device to which a general polarizer without the light absorbing pattern ABS is applied, at each viewing angle. The Narrow BM value may represent the luminance ratio according to of the organic light emitting display including the light absorbing pattern ABS whose size is determined according to Equation 1. In general, the luminance ratio at the viewing angle of 45° may be required to be at least 45% in comparison with the luminance ratio at the viewing angle of 0°. In the organic light emitting display device using only the general polarizer without the light absorbing pattern ABS, the luminance ratio at the viewing angle of 45° may reach 50%. In the organic light emitting display device to which the light absorbing pattern ABS according to the present embodiment is applied, the luminance ratio at the viewing angle of 45° may reach 45%. In other words, the application of the light absorbing pattern ABS may cause a slight reduction of the luminance ratio at the viewing angle of 45°. However, at the viewing angle of less than 45°, the organic light emitting display device according to the embodiment may have the viewing angle/luminance ratio which is similar to that of the general organic light emitting display.

A typical organic light emitting display may have a good viewing angle/luminance ratio. However, as shown in FIG. 11A, since the characteristics of reflective color are very weak, outdoor visibility may be poor and it may be difficult to realize real black. On the contrary, the display device according to the embodiment may enhance outdoor visibility and may realize a product close to real black by improving the characteristics of reflective color as shown in FIG. 11B while maintaining the viewing angle/luminance ratio.

Figure 13A:
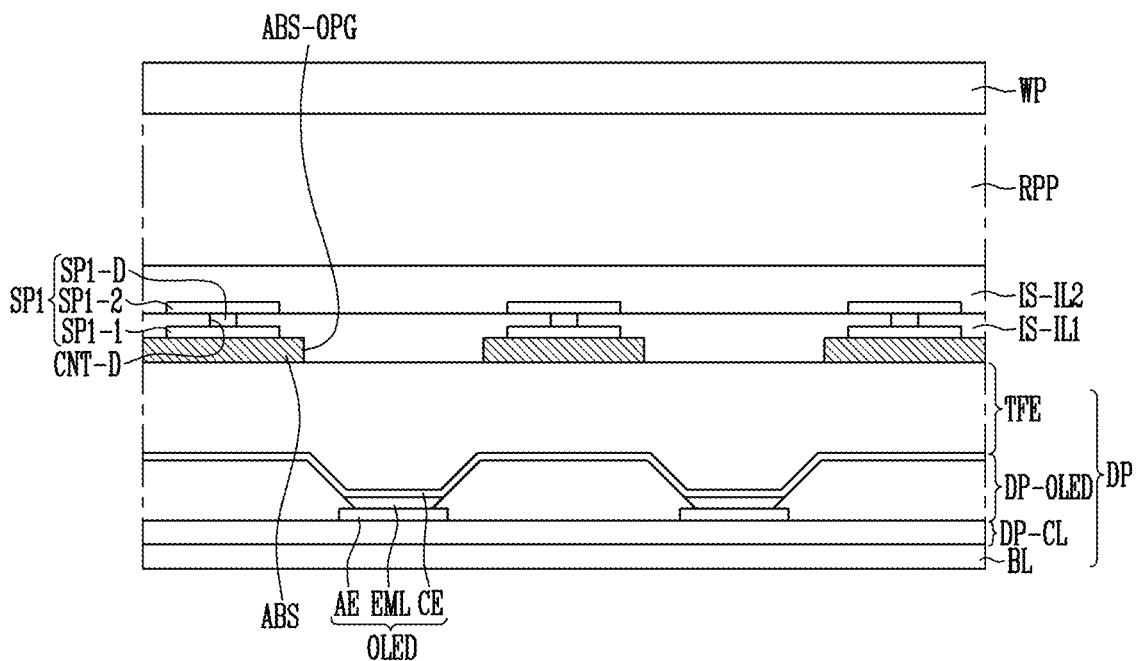
FIGS. 13A, 13B, and 13C are cross-sectional views illustrating another exemplary embodiment of a display device.
Figure 13B:
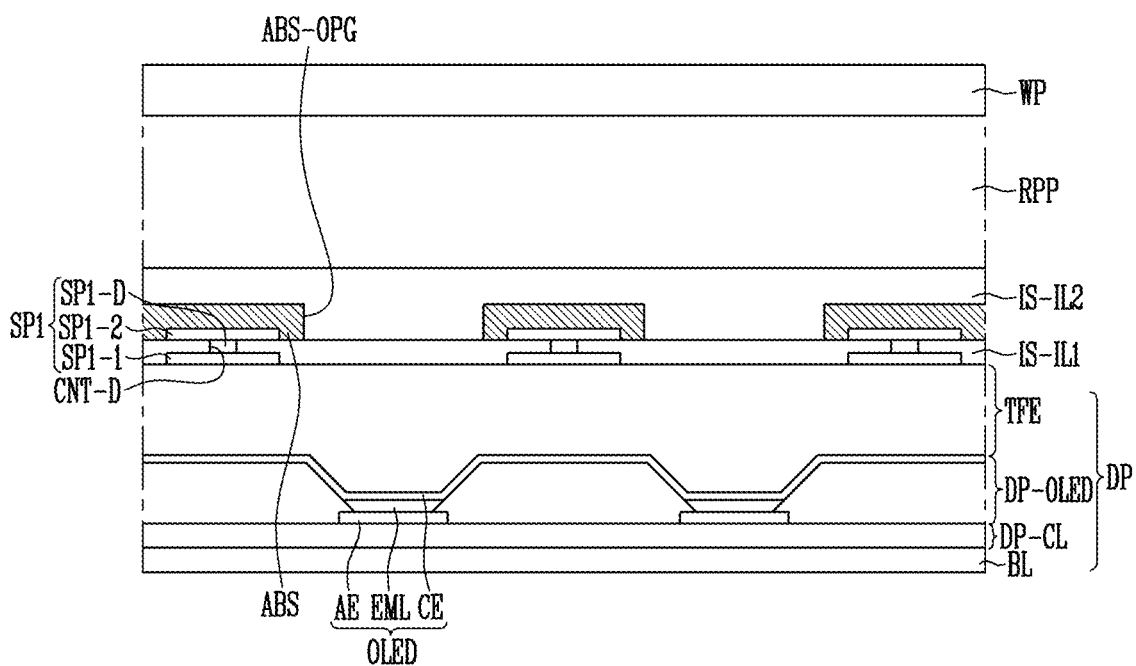
Figure 13C:
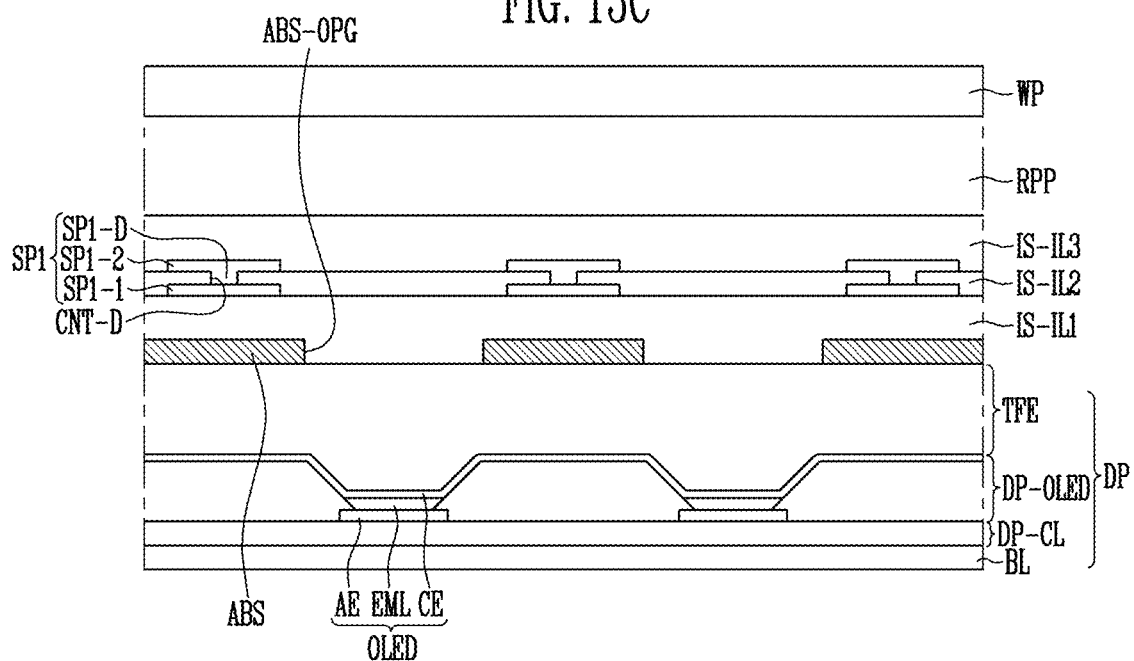

FIGS. 13A to 13C are cross-sectional views illustrating the display device according to another embodiment. Hereinafter, a detailed description of the same configuration as the display device DD described with reference to FIGS. 1 to 7 will be omitted. The embodiments described with reference to FIGS. 8 to 10 are equally applicable to the input sensing unit ISU to be described below.

Each of the display devices DD shown in FIGS. 13A to 13C differs from the display device DD shown in FIG. 10 in terms of the position where the sensing electrode and the light absorbing pattern ABS are disposed. The differences are as follows.

In the display device DD shown in FIG. 13A, the first sensing portion SP1 may be disposed on the light absorbing pattern ABS. That is, in the display device DD shown in FIG. 10, the light absorbing pattern ABS may be sandwiched between the first mesh pattern SP1-1 and the second mesh pattern SP1-2 forming the first sensing portion SP1. However, in the display device DD shown in FIG. 13A, the light absorbing pattern ABS may be formed on the thin film encapsulating layer TFE. After the first mesh pattern SP1-1 may be formed on the light absorbing pattern ABS, the second mesh pattern SP1-2 may be formed on the first mesh pattern SP1-1. The first insulating layer IS-IL1 may be formed between the first mesh pattern SP1-1 and the second mesh pattern SP1-2. The connection contact hole CNT-D may be formed in the first insulation layer IS-IL1. The contact portion SP1-D may be formed in the connection contact hole CNT-D to electrically connect the first mesh pattern SP1-1 and the second mesh pattern SP1-2. The second insulating layer IS-IL2 may be formed on the second mesh pattern SP1-2. The second insulating layer IS-IL2 may entirely cover the second mesh pattern SP1-2 and may function as a planarizing layer.

In the display device DD shown in FIG. 13B, the light absorbing pattern ABS may be disposed on the first sensing portion SP1. That is, in the display device DD shown in FIG. 10, the light absorbing pattern ABS may be sandwiched between the first mesh pattern SP1-1 and the second mesh pattern SP1-2 forming the first sensing portion SP1. However, in the display device DD shown in FIG. 13B, the first sensing portion SP1 may be formed on the thin film encapsulating layer TFE and the light absorbing pattern ABS may be formed on the first sensing portion SP1. Specifically, after the first mesh pattern SP1-1 may be formed on the thin film encapsulating layer TFE, the second mesh pattern SP1-2 may be formed on the first mesh pattern SP1-1. The first insulating layer IS-IL1 may be formed between the first mesh pattern SP1-1 and the second mesh pattern SP1-2. The connection contact hole CNT-D may be formed in the first insulation layer IS-IL1. The contact portion SP1-D may be formed in the connection contact hole CNT-D to electrically connect the first mesh pattern SP1-1 and the second mesh pattern SP1-2. The light absorbing pattern ABS may be formed on the second mesh pattern SP1-2. The second insulating layer IS-IL2 may be formed after the aperture ABS-OPG is formed in the light absorbing pattern ABS so as to correspond to the light emitting area PXA. The second insulating layer IS-IL2 may entirely cover the light absorbing pattern ABS and may function as a planarizing layer.

The display device DD shown in FIG. 13C may be similar to the display device DD shown in FIG. 13A in that the first sensing portion SP1 is disposed on the light absorbing pattern ABS, and may be different therefrom in that an insulating layer is disposed between the first sensing portion SP1 and the light absorbing pattern ABS. That is, the display device DD shown in FIG. 13A may be formed by forming the light absorbing pattern ABS on the thin film encapsulating layer TFE, forming the aperture ABS-OPG corresponding to the light emitting area PXA in the light absorbing pattern ABS, and forming the first insulating layer IS-IL1 thereon. The first insulating layer IS-IL1 may entirely cover the light absorbing pattern ABS and may function as a planarizing layer. After the first mesh pattern SP1-1 is formed on the first insulating layer IS-ILL the second mesh pattern SP1-2 may be formed on the first mesh pattern SP1-1. The second insulating layer IS-IL2 may be formed between the first mesh pattern SP1-1 and the second mesh pattern SP1-2. The connection contact hole CNT-D may be formed in the second insulation layer IS-IL2 and the contact portion SP1-D may be formed in the connection contact hole CNT-D. The first mesh pattern SP1-1 and the second mesh pattern SP1-2 may be electrically connected by the contact portion SP1-D. A third insulating layer IS-IL3 may be formed again on the second mesh pattern SP1-2. The third insulating layer IS-IL3 may entirely cover the second mesh pattern SP1-2 and may function as a planarizing layer.

The display device DD shown in FIGS. 13A to 13C may include a sensing electrode having the first mesh pattern and the second mesh pattern electrically connected to each other, like the display device DD shown in FIG. 10. Therefore, the resistance of the sensing electrode may be reduced, so that RC delay may be improved.

Figure 14:
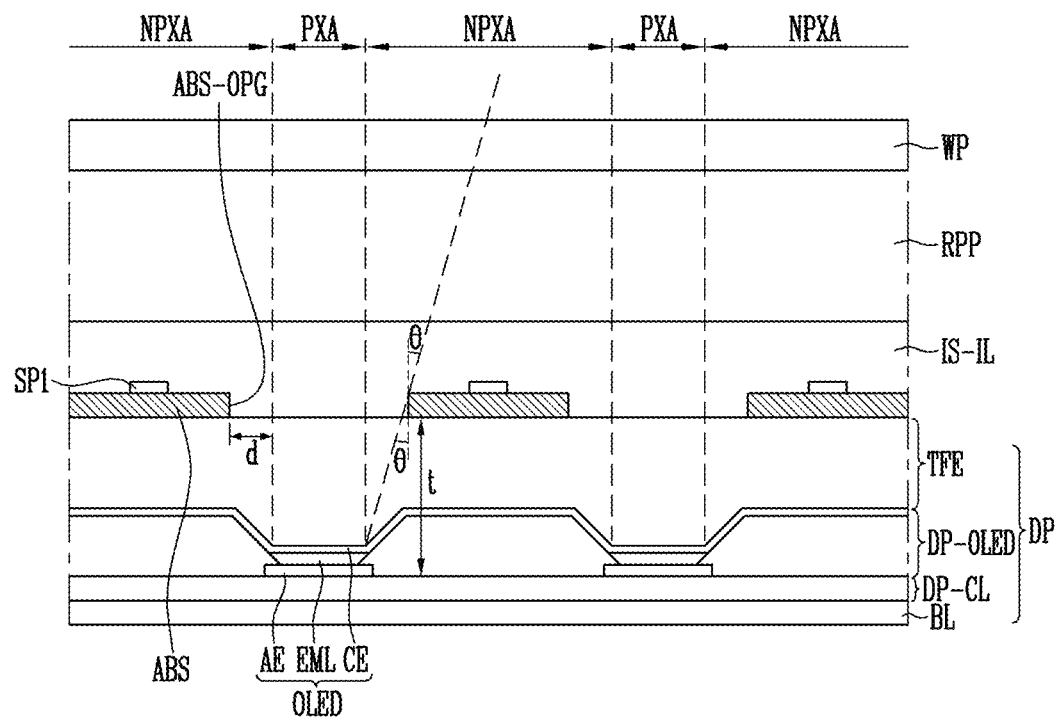
FIG. 14 is a cross-sectional view illustrating another exemplary embodiment of a display device.

FIG. 14 is a sectional view showing the display device DD according to another embodiment. Hereinafter, a detailed description of the same configuration as the display device DD described with reference to FIGS. 1 to 7 will be omitted. The embodiments described with reference to FIGS. 8 to 10 are equally applicable to the input sensing unit ISU described below.

The display device DD shown in FIG. 14 may differ from the display device DD shown in FIG. 10 in terms of the form of the sensing electrodes. In other words, the display device DD shown in FIG. 14 may have the sensing electrode formed of one layer of the mesh pattern SP1-1. However, the display device DD shown in FIG. 10 may have the sensing electrode formed of two mesh patterns (i.e., the first mesh pattern SP1-1 and the second mesh pattern SP1-2). More specifically, the display device DD of FIG. 14 may be formed by forming the light absorbing pattern ABS on the thin film encapsulating layer TFE, forming the first sensing portion SP1 on the light absorbing pattern ABS, and forming the insulating layer IS-IL on the first sensing portion SP1. The reflection preventing panel RPP may be provided on the insulating layer IS-IL.

Figure 15:
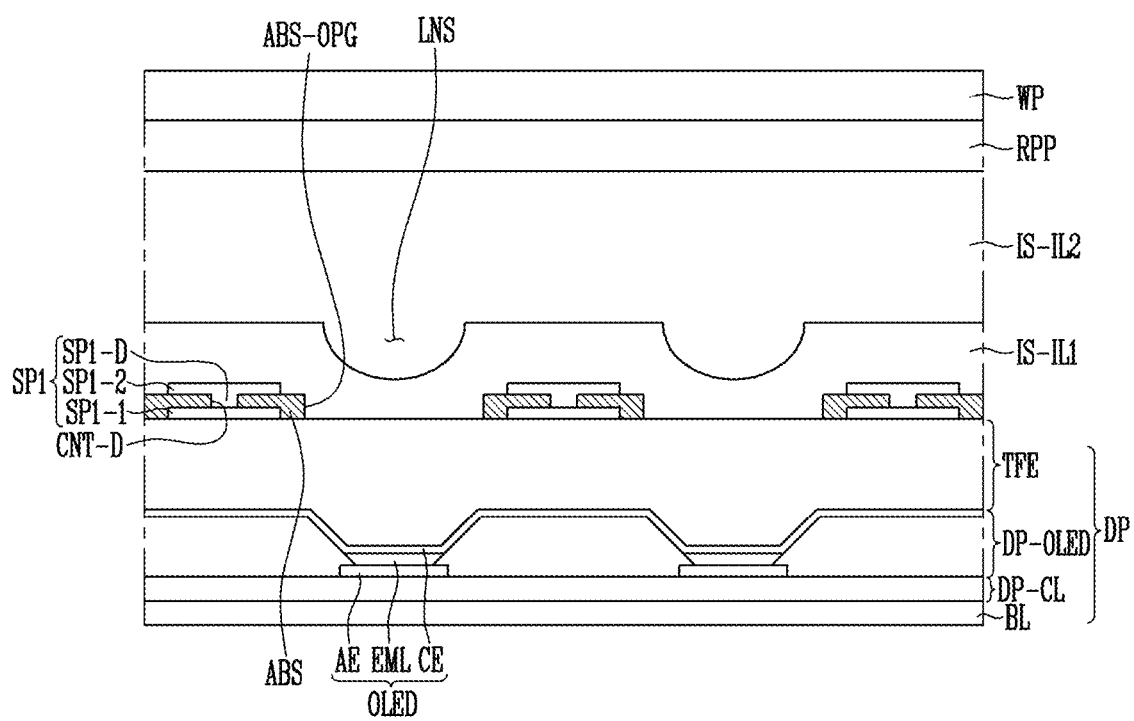
FIG. 15 is a cross-sectional view illustrating another exemplary embodiment of a display device.
Figure 16A:
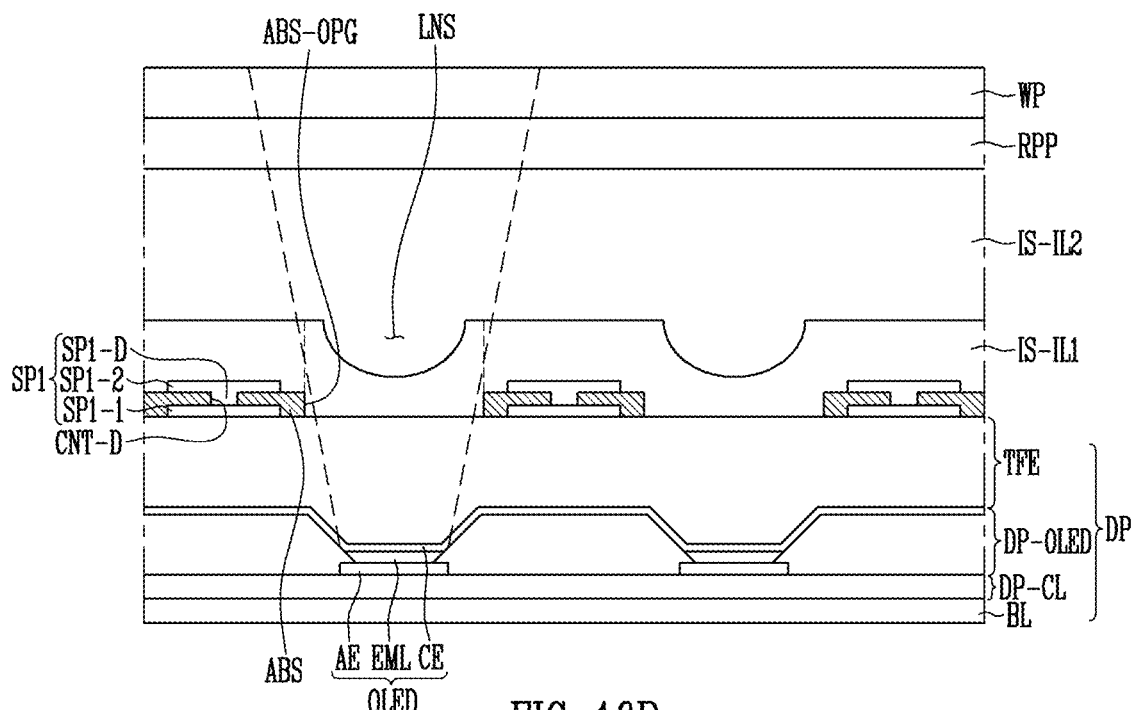
FIGS. 16A, 16B, and 16C are cross-sectional views illustrating the display device including a light path changing portion having a different size.
Figure 16B:
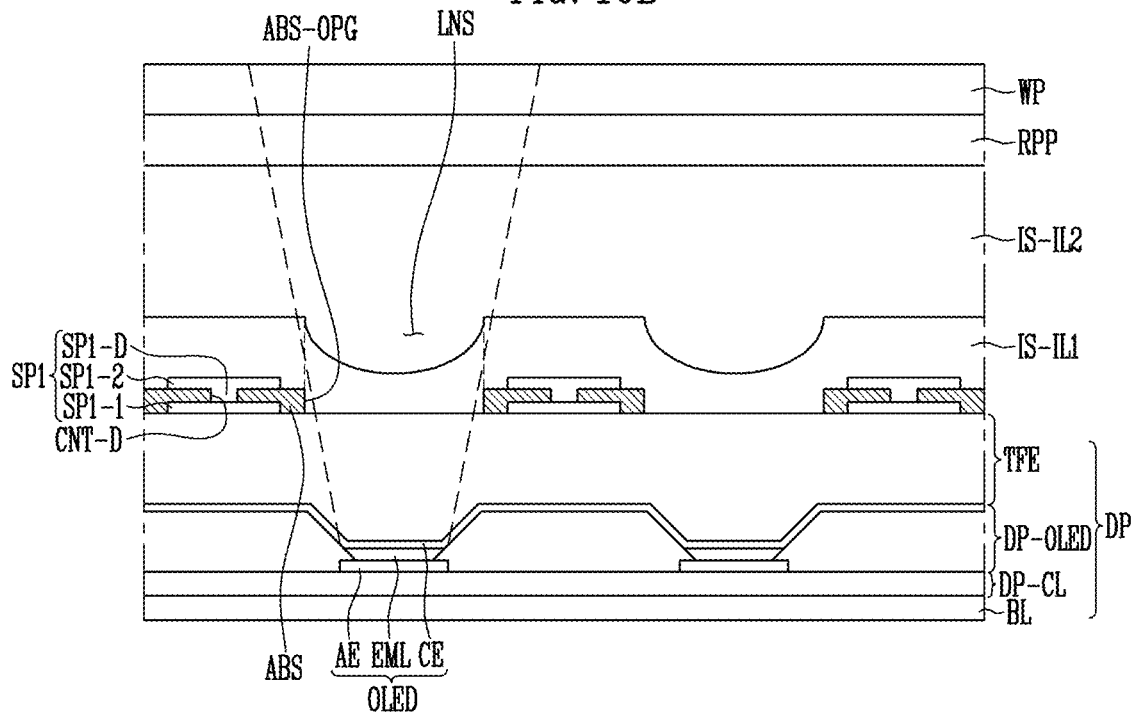
Figure 16C:
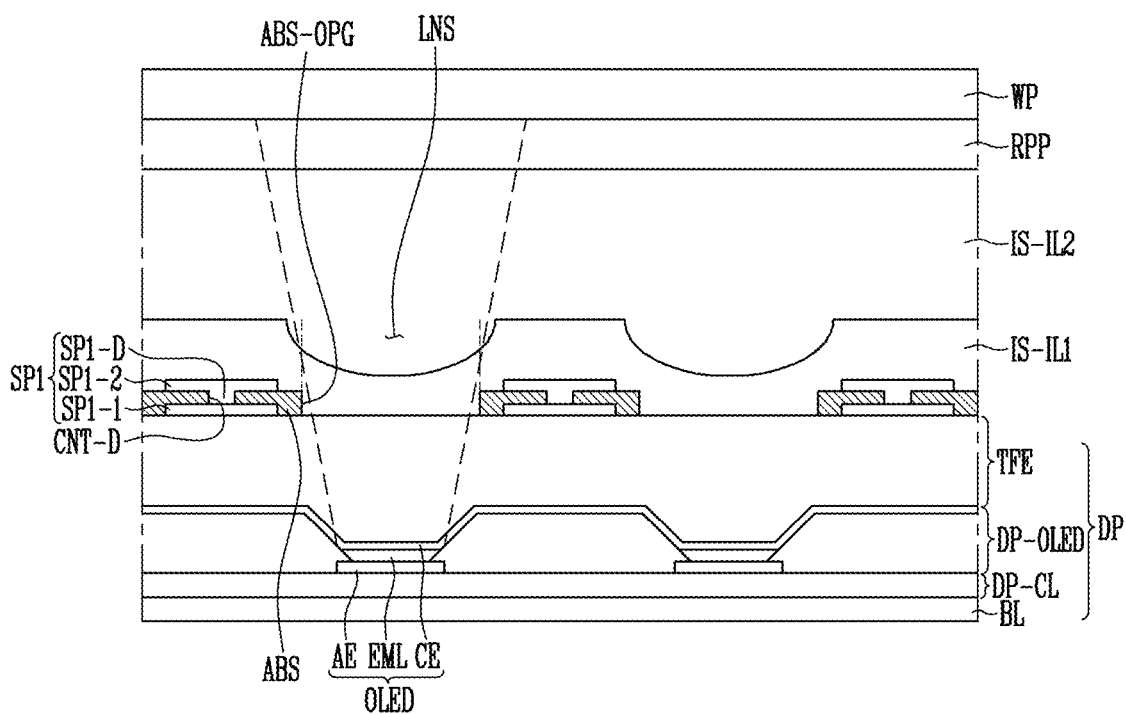

FIG. 15 is a cross-sectional view showing the display device DD according to another embodiment. FIGS. 16A to 16C are cross-sectional views showing the display device DD having a light path changing portion having a different size. Hereinafter, a detailed description of the same configuration as the display device DD described with reference to FIGS. 1 to 7 will be omitted. The embodiments described with reference to FIGS. 8 to 10 are equally applicable to the input sensing unit ISU described below.

The display device DD shown in FIG. 15 may differ from the display device DD shown in FIG. 10 in that the display device DD further includes the light path changing portion LNS. That is, the display device DD shown in FIG. 10 may be provided with the reflection preventing panel RPP directly on the insulating layer IS-IL covering the sensing electrodes. However, in the display device DD shown in FIG. 15, the light path changing portion LNS may be provided between the first insulating layer IS-IL1 and the reflection preventing panel RPP.

Specifically, the display device DD shown in FIG. 15 may include a groove formed to protrude toward the display element layer DP-OLED on the first insulating layer IS-IL1 covering the light absorbing pattern ABS and the sensing electrode formed on the thin film encapsulating layer TFE. The second insulating layer IS-IL2 may be formed on the first insulating layer IS-IL1 and may fill the groove. That is, the second insulating layer IS-IL2 may function as a planarizing layer.

The second insulating layer IS-IL2 may have a higher refractive index than the first insulating layer IS-IL1. The light emitted from the light emitting element may be transferred to the second insulating layer IS-IL2 through the first insulating layer IS-IL1. By using index matching, the refractive index of the second insulating layer IS-IL2 through which the light is transmitted later may be larger than the refractive index of the first insulating layer IS-IL1, so that light trapped at the interface between the thin film encapsulating layer TFE and air may be easily extracted.

The light path changing portion LNS may refer to a portion of the groove formed on the first insulating layer IS-IL1 which is filled with the second insulating layer IS-IL2. The path of the light passing through the light path changing portion LNS may be changed due to the differences in the geometrical shape and the refractive index of the light path changing portion LNS. The light path changing portion LNS shown in FIG. 15 may condense the light incident on the light path changing portion LNS, sometimes called the light path changing unit LNS.

Specifically, the groove of the light path changing portion LNS may be formed to be convex toward the organic light emitting diode OLED. The first insulating layer IS-IL1 and the second insulating layer IS-IL2 may be media which are sequentially disposed on the path of light emitted from the organic light emitting diode OLED. The refractive index of the first insulating layer IS-IL1 may be greater than the refractive index of the second insulating layer IS-IL2. Therefore, the light path changing unit LNS shown in FIG. 15 may perform the function of a convex lens for condensing light.

The light emitted from the organic light emitting diode OLED may be condensed while passing through the light path changing portion LNS, so that the luminance at the front face of the display device DD may be increased. That is, the light path changing unit LNS may increase the light extraction efficiency of the display device DD.

Since the display device DD according to the embodiment comprises the light absorbing pattern ABS, it may be possible to prevent the reflection of external light and improve the reflective color as described above. However, the light absorbing pattern ABS may absorb not only external light but also light emitted from the light emitting element. Accordingly, the light absorbing pattern ABS for improving the reflective color may reduce light extraction efficiency. However, the display device DD according to an embodiment may include the light path changing portion LNS as well as the light absorbing pattern ABS, thereby improving the characteristics of reflective color and preventing reduction of luminance. Thus, the viewing angle/luminance ratio of the display device DD may be improved.

The light path changing portion LNS may overlap with the aperture ABS-OPG of the light absorbing pattern ABS. More specifically, as shown in FIGS. 16A and 16B, the light path changing portion LNS may have a size equal to or smaller than the size of the aperture ABS-OPG. As described above, the light path changing portion LNS may change a path of light emitted from an organic light emitting diode to condense light, depending on the shape of the light path changing portion LNS, to thereby increase luminance at the front of the display device DD or improve the viewing angle/luminance ratio and improve WAD.

The light path changing portion LNS shown in FIGS. 16A and 16B, which is formed to be equal to or smaller than the size of the aperture ABS-OPG may have a higher light converging effect than the light path changing portion LNS shown in FIG. 16C, which is formed larger than the aperture ABS-OPG.

In other words, the thickness of the first insulating layer IS-IL1 in which the light path changing portion LNS is formed may be limited, and the sensing electrode and the light absorbing pattern ABS may be provided in the first insulating layer IS-IL1. Therefore, the curvature of the light path changing portion LNS may be limited.

The light path changing portion LNS shown in FIGS. 16A and 16B, which is formed to be equal to or smaller than the size of the aperture ABS-OPG, may have a smaller curvature than the light path changing portion LNS shown in FIG. 16C, which is formed larger than the aperture ABS-OPG. The smaller the curvature of the light path changing portion LNS may be, the shorter the focal length may be. The smaller the focal length may be, the stronger the divergence and convergence of the lens may be. The larger the focal length may be, the weaker the divergence and convergence of the lens may be. Since the curvature of the light path changing portion LNS shown in FIGS. 16A and 16B is smaller than that of the light path changing portion LNS shown in FIG. 16C, the light path changing portion LNS shown in FIGS. 16A and 16B may have a shorter focal length than the light path changing portion LNS shown in FIG. 16C. Therefore, the light path changing unit LNS shown in FIGS. 16A and 16B may have a larger condensing effect than the light path changing unit LNS shown in FIG. 16C.

In addition, by increasing the refractive index of the second insulating layer IS-IL2 to be larger than the refractive index of the first insulating layer IS-ILL the light condensing effect due to the index matching between the first insulating layer IS-IL1 and the second insulating layer IS-IL2 may be further enhanced.

Figure 17A:
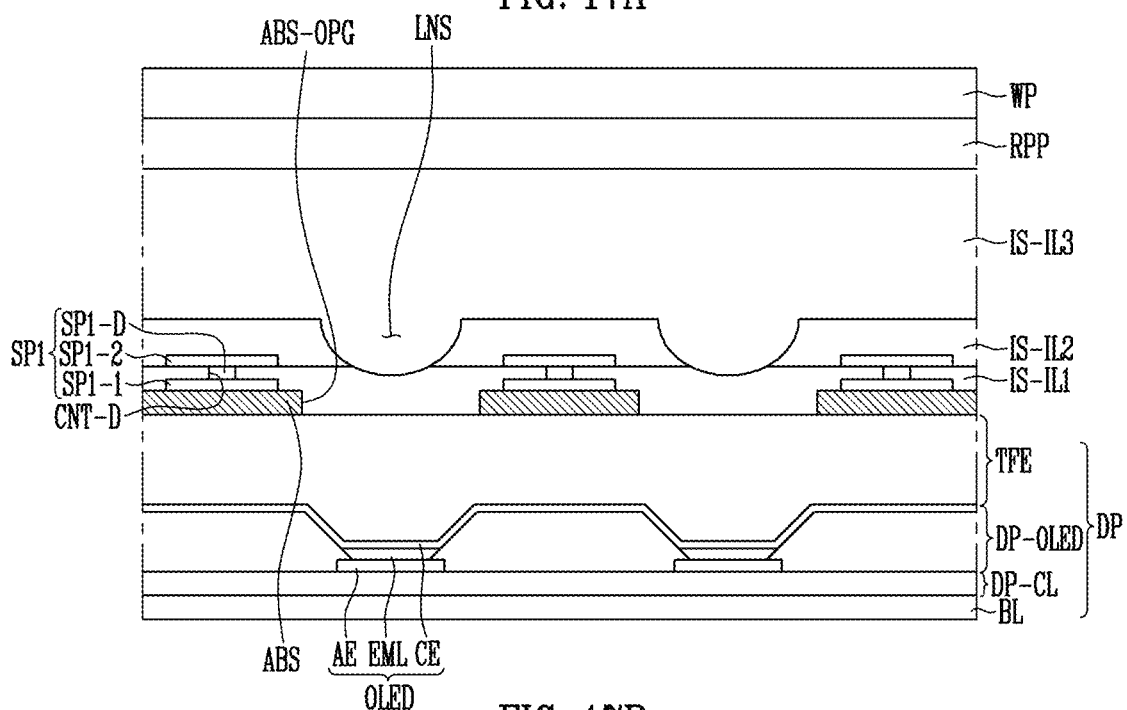
FIGS. 17A and 17B are cross-sectional views illustrating another exemplary embodiment of a display device.
Figure 17B:
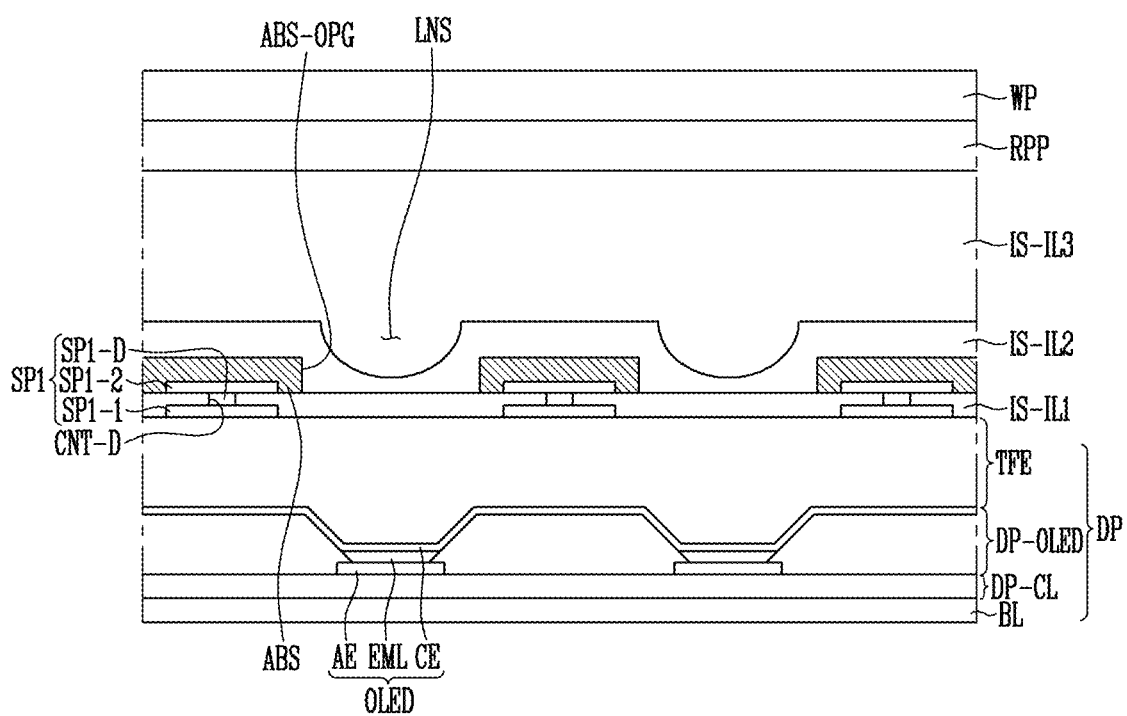

FIGS. 17A and 17B are cross-sectional views illustrating a display device according to another embodiment. Hereinafter, a detailed description of the same configuration as the display device DD described with reference to FIGS. 1 to 7 will be omitted. The embodiments described with reference to FIGS. 8 to 10 are equally applicable to the input sensing unit ISU described below.

Each of the display devices DD shown in FIGS. 17A and 17B may differ from the display device DD shown in FIG. 15 in terms of the positions where the sensing electrode and the light absorbing pattern ABS are formed. These differences are described as follows.

In the display device DD shown in FIG. 17A, the first sensing portion SP1 may be disposed on the light absorbing pattern ABS.

That is, in the display device DD shown in FIG. 15, the light absorbing pattern ABS may be provided between the first mesh pattern SP1-1 and the second mesh pattern SP1-2 which are included in the first sensing portion SP1. However, in the display device DD shown in FIG. 17A, the light absorbing pattern ABS may be formed on the thin film encapsulating layer TFE, the first mesh pattern SP1-1 may be formed on the light absorbing pattern ABS, and the second mesh pattern SP1-2 may be formed on the first mesh pattern SP1-1.

The first insulating layer IS-IL1 may be formed between the first mesh pattern SP1-1 and the second mesh pattern SP1-2. The first contact hole CNT-D may be formed in the first insulation layer IS-IL1. The contact portion SP1-D may be formed in the connection contact hole CNT-D. Therefore, the contact portion SP1-D may electrically connect the first mesh pattern SP1-1 and the second mesh pattern SP1-2.

The second insulating layer IS-IL2 may be formed on the second mesh pattern SP1-2. A groove protruding toward the display element layer DP-OLED may be formed on the second insulating layer IS-IL2. The third insulating layer IS-IL3 may be formed on the second insulating layer IS-IL2 to fill the groove. That is, the third insulating layer IS-IL3 may function as a planarizing layer.

In the display device DD shown in FIG. 17B, the light absorbing pattern ABS may be disposed on the first sensing portion SP1. That is, in the display device DD shown in FIG. 15, the light absorbing pattern ABS may be disposed between the first mesh pattern SP1-1 and the second mesh pattern SP1-2 which are included in the first sensing portion SP1. However, in the display device DD shown in FIG. 17B, the first sensing portion SP1 may be formed on the thin film encapsulating layer TFE and the light absorbing pattern ABS may be formed on the first sensing portion SP1. Specifically, the first mesh pattern SP1-1 may be formed on the thin film encapsulating layer TFE and the second mesh pattern SP1-2 may be formed on the first mesh pattern SP1-1. The first insulating layer IS-IL1 may be formed between the first mesh pattern SP1-1 and the second mesh pattern SP1-2. The connection contact hole CNT-D may be formed in the first insulating layer IS-IL1 and the contact portion SP1-D may be formed in the connection contact hole CNT-D. Therefore, the contact portion SP1-D may electrically connect the first mesh pattern SP1-1 and the second mesh pattern SP1-2.

The light absorbing pattern ABS may be formed on the second mesh pattern SP1-2. The second insulating layer IS-IL2 may be formed after the aperture ABS-OPG is formed in the light absorbing pattern ABS so as to correspond to the light emitting area PXA. The groove protruding toward the display element layer DP-OLED may be formed on the second insulating layer IS-IL2. The third insulating layer IS-IL3 may be formed on the second insulating layer IS-IL2 and may fill the groove. That is, the third insulating layer IS-IL3 may function as a planarizing layer.

Figure 18A:
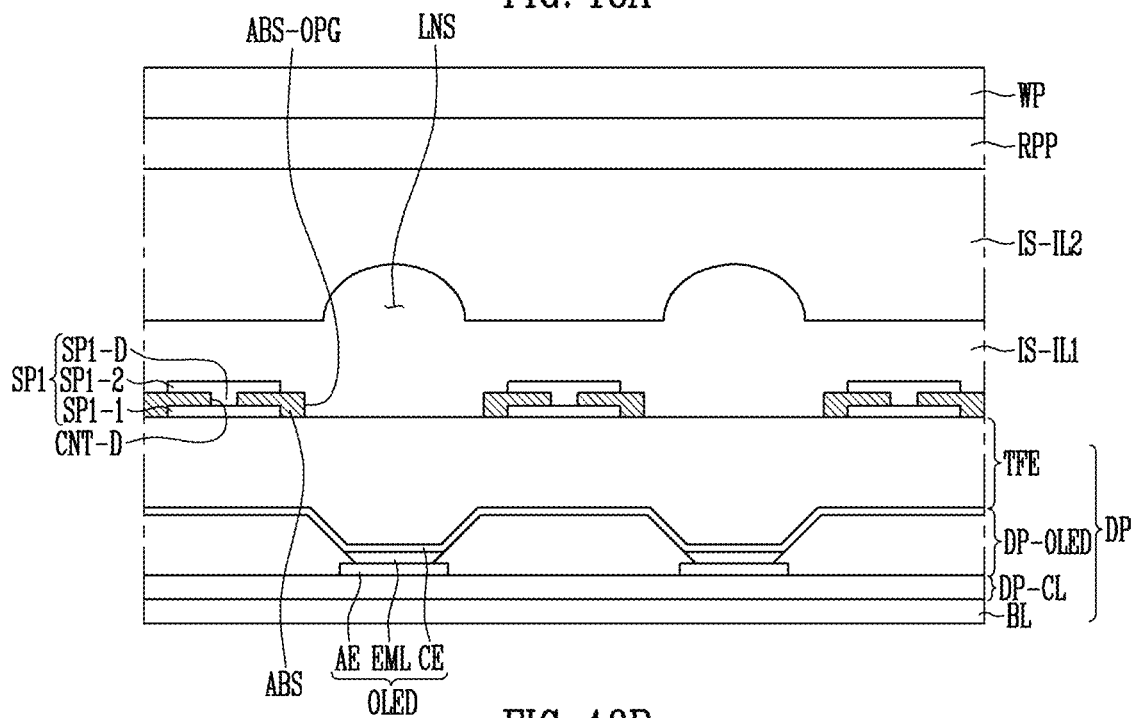
FIGS. 18A, 18B, and 18C are cross-sectional views illustrating another exemplary embodiment of a display device.
Figure 18B:
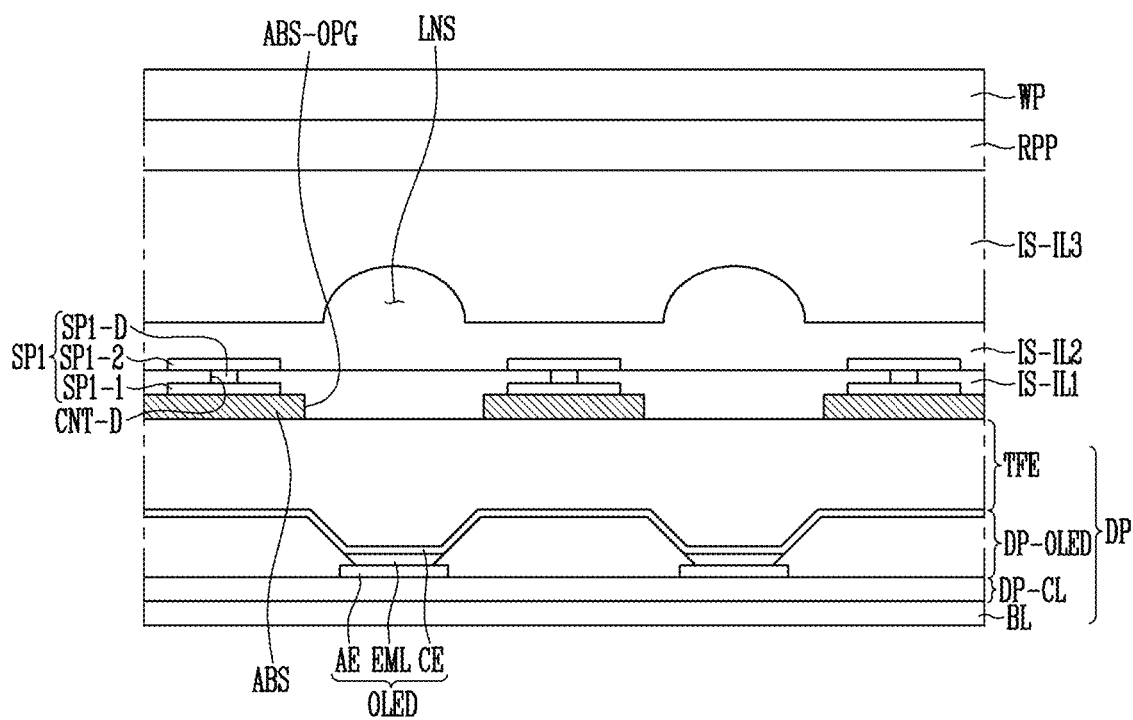
Figure 18C:
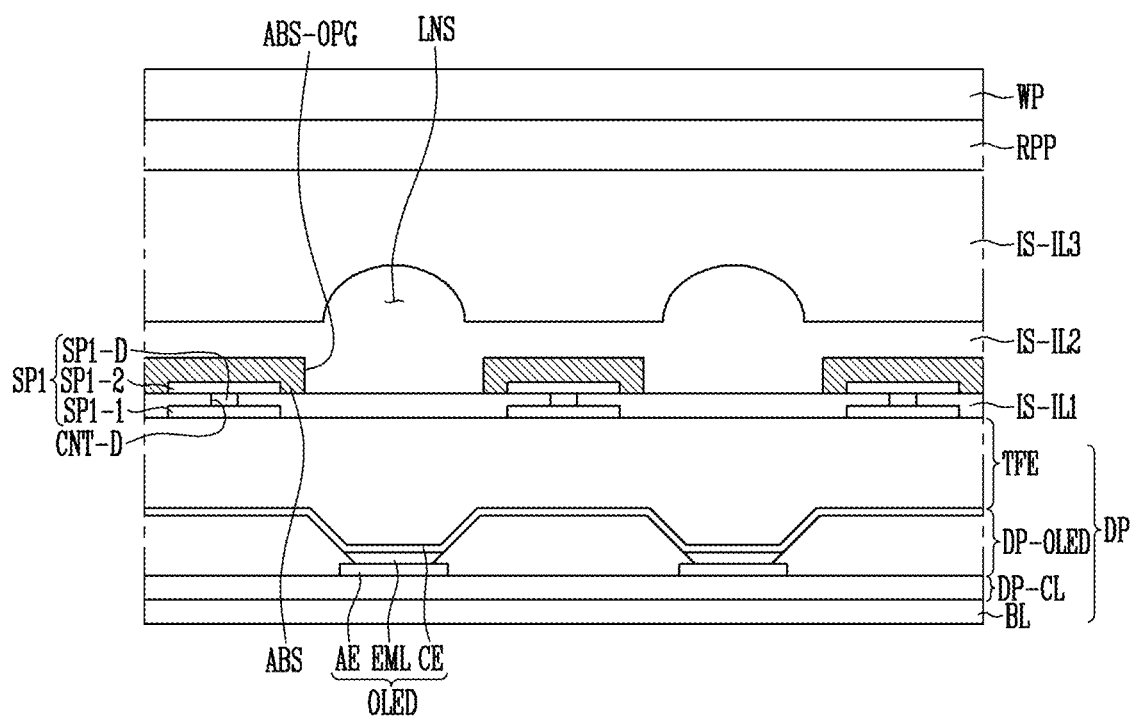

FIGS. 18A to 18C are cross-sectional views illustrating a display device according to another embodiment. Hereinafter, a detailed description of the same configuration as the display device DD described with reference to FIGS. 1 to 7 will be omitted. The embodiments described with reference to FIGS. 8 to 10 are equally applicable to the input sensing unit ISU described below. Each of the display devices DD shown in FIGS. 18A to 18C may be formed by the same method as the display devices DD shown in FIGS. 15, 17A, and 17B until the light path changing portion LNS is formed. Since the elements are the same, a description thereof will be omitted.

Each of the display devices DD shown in FIGS. 18A to 18C may correspond to each of the display devices DD shown in FIGS. 15, 17A and 17B, and the shapes of the light path changing portions LNS may be different from each other. That is, the light path changing portion LNS of each of the display devices DD shown in FIGS. 15, 17A, and 17B may protrude toward the display element layer DP-OLED. The light path changing portion LNS may be regarded as a convex lens in view of a light emitting element that emits light. However, the light path changing portion LNS of the display devices DD shown in FIGS. 18A to 18C may be opposed to the display element layer DP-OLED. In other words, the light path changing portion LNS may protrude toward the reflection preventing panel RPP. The light path changing portion LNS may be regarded as a concave lens in view of a light emitting element that emits light.

The light path changing portion LNS shown in FIGS. 18A to 18C may be formed to overlap the aperture ABS-OPG of the light absorbing pattern ABS. More specifically, the light path changing unit LNS may be equal to or smaller than the size of the aperture ABS-OPG. As described above, the light path changing unit LNS may change the path of the light emitted from the light emitting device and condense or scatter light according to the shape of the light path changing unit LNS. Thus, the luminance at the front face of the display device DD may be increased, and the viewing angle/luminance ratio and WAD may be improved. The light path changing portion LNS shown in FIGS. 18A to 18C may be convex toward the outside of the display device DD, and thus may function as a concave lens. Accordingly, the light emitted from the light emitting device may be scattered by the light path changing unit LNS, thereby improving the viewing angle/luminance ratio and further improving the WAD.

The light path changing portion LNS which is formed to be equal to or smaller than the size of the aperture ABS-OPG may enhance the scattering effect more than the light path changing portion LNS which is formed larger than the aperture ABS-OPG as shown in FIGS. 18A to 18C.

The thickness of the second insulating layer IS-IL2 (the third insulating layer IS-IL3 in FIGS. 18B and 18C) in which the light path changing portion LNS is formed is limited. Also, since the reflection preventing panel RPP is disposed on the second insulating layer IS-IL2, the curvature of the light path changing portion LNS may be limited. The light path changing portion LNS which is formed to be equal to or smaller than the size of the aperture ABS-OPG may be formed to have a smaller curvature than the light path changing portion LNS which is formed larger than the aperture ABS-OPG. When the curvature is smaller, the focal length may be smaller. The smaller the focal length may be, the stronger the divergence and convergence of the lens may be. The larger the focal length is, the weaker the divergence and convergence of the lens may be. By reducing the curvature, the focal length may be shortened, so that the scattering effect may be increased. For example, by making the light path changing portion LNS equal to or smaller than the aperture ABS-OPG of the light absorbing pattern ABS, the focal distance may be shortened, so that the scattering effect may be increased.

The display device DD according to the embodiment may be provided with the light path changing portion LNS having such a scattering effect, so that even when the light absorbing pattern ABS is provided for improving the characteristics of reflective color, the viewing angle/luminance ratio required in the industry may be maintained without being decreased.

According to the embodiment, a reflective color of a display device may be improved and the viewing angle/luminance ratio may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the inventive concept as set forth in the following claims.

What is claimed is:

1. A display device comprising:
   a display panel comprising a plurality of light emitting areas and a plurality of non-light emitting areas; and
   an input sensing unit provided on the display panel, the display panel comprising:
   a base layer;
   a light emitting element provided on the base layer;
   a pixel defining layer defining a position of the light emitting element; and
   a sealing layer covering the light emitting element and the pixel defining layer,
   wherein a light emitting area of the light emitting areas is defined as an area on the light emitting element exposed by the pixel defining layer, and each of the plurality of non-light emitting areas is defined as an area on the pixel defining layer,
   wherein the sealing layer includes one or more layers,
   the input sensing unit comprising:
   a light absorbing pattern provided corresponding to the plurality of non-light emitting areas and configured to absorb incident light; and
   a sensing electrode overlapping the light absorbing pattern,
   wherein the light absorbing pattern has an aperture for exposing the light emitting area, wherein the light absorbing pattern is provided such that a boundary of the aperture and an outer boundary of the light emitting area are spaced apart from each other, wherein the input sensing unit includes an insulating layer having a light path changing portion that is configured to change a path of light incident on the insulating layer corresponding to the aperture, and wherein the path of light incident is started from the light emitting element and sequentially passes the sealing layer, the aperture of the light absorbing pattern, and the light path changing portion.

2. The display device of claim 1, wherein a distance d between the boundary of the aperture and the outer boundary of the light emitting area is determined by the following Equation 1, $$d = \sum_{i=1}^{k} t_i \tan\left(\frac{1}{n_i}\sin\left(D\frac{\Pi}{180°}\right)\right)$$

wherein k is a natural number, $t_i$ is a thickness of an i-th layer of the sealing layer, $n_i$ is a refractive index of the i-th layer of the sealing layer, and D is a tilt angle of the display device with respect to a plane.

3. The display device of claim 2, wherein the tilt angle D is a viewing angle when a luminance ratio of the display device is measured for each viewing angle, and wherein the distance d is determined according to Equation 1 so as to ensure the luminance ratio with the viewing angle of the display device with respect to a predetermined viewing angle.

4. The display device of claim 1, wherein a width or area of the aperture is larger than a width or area of the light emitting area.

5. The display device of claim 1, wherein the boundary of the aperture does not invade the outer boundary of the light emitting area.

6. The display device of claim 1, wherein the light absorbing pattern overlaps on the non-light emitting areas.

7. The display device of claim 1, wherein the light path changing portion protrudes toward the light emitting area.

8. The display device of claim 1, wherein the light path changing portion protrudes opposite the light emitting area.

9. The display device of claim 1, wherein the insulating layer includes a first insulating layer covering the sensing electrode and a second insulating layer provided on the first insulating layer, and wherein the light path changing portion is provided between the first insulating layer and the second insulating layer.

10. The display device of claim 9, wherein the second insulating layer has a refractive index higher than a refractive index of the first insulating layer.

11. The display device of claim 1, wherein the light path changing portion overlaps the light emitting area.

12. The display device of claim 1, wherein a diameter or area of the light path changing portion is smaller than or equal to a width or area of the aperture.

13. The display device of claim 1, wherein the sensing electrode has a mesh pattern that does not overlap the light emitting area.

14. The display device of claim 13, wherein the mesh pattern is provided so as to overlap the light absorbing pattern.

15. The display device of claim 13, wherein the mesh pattern comprises a metal line forming at least one mesh hole, and wherein a width of the metal line is smaller than a width of the light absorbing pattern.

16. The display device of claim 15, wherein the mesh hole is larger than the aperture.

17. The display device of claim 13, wherein the sensing electrode includes a first mesh pattern and a second mesh pattern, and wherein the second mesh pattern is located on and separated from the first mesh pattern and is electrically connected to the first mesh pattern by at least one contact portion.

18. The display device of claim 17, wherein the light absorbing pattern is disposed between the first mesh pattern and the second mesh pattern, and wherein the at least one contact portion electrically connects the first mesh pattern and the second mesh pattern through a connection contact hole in the light absorbing pattern.

19. The display device of claim 17, wherein the input sensing unit includes an insulating layer having a multilayer structure including a plurality of insulating layers, wherein at least one insulating layer, among the plurality of insulating layers, is disposed between the first mesh pattern and the second mesh pattern, and wherein the at least one contact portion electrically connects the first mesh pattern and the second mesh pattern through a connection contact hole passing through the at least one insulating layer disposed between the first mesh pattern and the second mesh pattern.

20. The display device of claim 19, wherein the first mesh pattern is located on the light absorbing pattern.

21. The display device of claim 19, wherein the light absorbing pattern is located on the second mesh pattern.

22. The display device of claim 13, wherein the sensing electrode comprises:

a first sensing electrode extending in a first direction; and a second sensing electrode extending in a second direction intersecting the first direction, wherein the first sensing electrode includes a plurality of first sensing portions arranged along the first direction and a plurality of first connecting portions connecting the first sensing portions to each other, wherein the second sensing electrode includes a plurality of second sensing portions arranged along the second direction and a plurality of second connecting portions connecting the second sensing portions to each other, wherein the plurality of first sensing portions and the plurality of second sensing portions are disposed on the same layer or on different layers, and wherein either the plurality of first connection portions or the plurality of second connection portions are disposed on the same layer as the first sensing portions.

23. The display device of claim 1, further comprising a reflection preventing panel configured to prevent external light incident on the display device from being reflected in the display device and going out.

24. The display device of claim 23, wherein the reflection preventing panel is provided on the input sensing unit, and wherein the light absorbing pattern is configured to absorb light incident on the light absorbing pattern among the external light reflected in the display device.

25. A display device comprising:

a display panel including a plurality of light emitting areas and a plurality of non-light emitting areas; and an input sensing unit provided on the display panel,
the display panel comprising:
a base layer;
a light emitting element provided on the base layer;
a pixel defining layer defining a position of the light emitting element; and
a sealing layer covering the light emitting element and the pixel defining layer,
wherein a light emitting area of the light emitting areas is defined as an area on the light emitting element exposed by the pixel defining layer, and each of the plurality of non-light emitting areas is defined as an area on the pixel defining layer,
the input sensing unit comprising:
a light absorbing pattern provided corresponding to the plurality of non-light emitting areas and configured to absorb incident light, and
a sensing electrode overlapping the light absorbing pattern,
wherein the light absorbing pattern has an aperture for exposing the light emitting area,
wherein a boundary of the aperture and an outer boundary of the light emitting area are spaced apart from each other and a luminance ratio according to a viewing angle of the display device is equal to or greater than a predetermined value,
wherein the input sensing unit includes an insulating layer having a light path changing portion that is configured to change a path of light incident on the insulating layer corresponding to the aperture, and
wherein the path of light incident is started from the light emitting element and sequentially passes the sealing layer, the aperture of the light absorbing pattern, and the light path changing portion.

26. The display device of claim 25, wherein a distance between the boundary of the aperture and the outer boundary of the light emitting area is set so that the luminance ratio of the display device at the viewing angle of 45° is 50% or more.

27. The display device of claim 25, wherein a distance d between the boundary of the aperture and the outer boundary of the light emitting area is determined by the following Equation 2, $$d = \sum_{i=1}^{k} t_i \tan\left(\frac{1}{n_i}\sin\left(D\frac{\Pi}{180°}\right)\right)$$

wherein k is a natural number, $t_i$ is a thickness of an i-th layer of the sealing layer, $n_i$ is a refractive index of the i-th layer of the sealing layer, and D is a tilt angle of the display device with respect to a plane.

28. The display device of claim 27, wherein the tilt angle D is the viewing angle when the luminance ratio of the display device is measured for each viewing angle, and
wherein the distance d is determined according to Equation 2 so as to ensure the luminance ratio with the viewing angle of the display device with respect to a predetermined viewing angle.

29. An input sensing unit comprising:
a base including a plurality of light-transmitting areas and non-light transmitting areas between adjacent light-transmitting areas of the plurality of light-transmitting areas;
a light absorbing pattern provided corresponding to the non-light transmitting areas and configured to absorb incident light, wherein the light absorbing pattern has an aperture for exposing a light-transmitting area of the light-transmitting areas;
a sensing electrode overlapping the light absorbing pattern; and
an insulating layer having a light path changing portion that is configured to change a path of light incident on the insulating layer corresponding to the aperture,
wherein a boundary of the aperture and an outer boundary of the light-transmitting area are spaced apart from each other,
wherein when the input sensing unit is provided on the display device, the luminance ratio according to the viewing angle of a display device has a predetermined value or more, and
wherein the path of light incident sequentially passes the base, the aperture of the light absorbing pattern, and the light path changing portion.

30. The input sensing unit of claim 29, wherein a distance between the boundary of the aperture and the outer boundary of the light-transmitting area is set so that the luminance ratio of the display device at the viewing angle of 45° is 50% or more.

31. The input sensing unit of claim 29, wherein when the display device includes a display panel having a light emitting element and a sealing layer covering the light emitting element, a distance d between the boundary of the aperture and the outer boundary of the light-transmitting area is determined by the following Equation 3, $$d = \sum_{i=1}^{k} t_i \tan\left(\frac{1}{n_i}\sin\left(D\frac{\Pi}{180°}\right)\right)$$

wherein k is a natural number, $t_i$ is a thickness of an i-th layer of the sealing layer, $n_i$ is a refractive index of the i-th layer of the sealing layer, and D is a tilt angle of the display device with respect to a plane.

32. The input sensing unit of claim 29, wherein a width or area of the aperture is larger than a width or area of the light-transmitting area.

33. The input sensing unit of claim 29, wherein the boundary of the aperture does not invade the outer boundary of the light-transmitting area.

34. The input sensing unit of claim 29, wherein the light absorbing pattern overlaps on the non-light transmitting areas.

35. The input sensing unit of claim 29, wherein the light path changing portion protrudes toward the light-transmitting area.

36. The input sensing unit of claim 29, wherein the light path changing portion protrudes opposite the light-transmitting area.

37. The input sensing unit of claim 29, wherein the insulating layer includes a first insulating layer covering the sensing electrode and a second insulating layer provided on the first insulating layer, and
wherein the light path changing portion is provided between the first insulating layer and the second insulating layer.

38. The input sensing unit of claim 37, wherein the second insulating layer has a refractive index higher than a refractive index of the first insulating layer.

39. The input sensing unit of claim 29, wherein the light path changing portion overlaps the light-transmitting area.

40. The input sensing unit of claim 29, wherein a diameter or area of the light path changing portion is smaller than or equal to a width or area of the aperture.

41. The input sensing unit of claim 29, wherein the sensing electrode has a mesh pattern that does not overlap the light-transmitting area.

42. The input sensing unit of claim 41, wherein the mesh pattern is provided so as to overlap the light absorbing pattern.

43. The input sensing unit of claim 41, wherein the mesh pattern comprises a metal line forming at least one mesh hole, and
   wherein a width of the metal line is smaller than a width of the light absorbing pattern.

44. The input sensing unit of claim 43, wherein the mesh hole is larger than the aperture.

45. The input sensing unit of claim 41, wherein the sensing electrode includes a first mesh pattern and a second mesh pattern, and
   wherein the second mesh pattern is located on and separated from the first mesh pattern and is electrically connected to the first mesh pattern by at least one contact portion.

46. The input sensing unit of claim 45, wherein the light absorbing pattern is disposed between the first mesh pattern and the second mesh pattern, and
   wherein the contact portion electrically connects the first mesh pattern and the second mesh pattern through a connection contact hole in the light absorbing pattern.

47. The input sensing unit of claim 45, further comprising an insulating layer having a multilayer structure including a plurality of insulating layers,
   wherein at least one insulating layer, among the plurality of insulating layers, is disposed between the first mesh pattern and the second mesh pattern, and
   wherein the contact portion electrically connects the first mesh pattern and the second mesh pattern through a connection contact hole passing through the at least one insulating layer disposed between the first mesh pattern and the second mesh pattern.

48. The input sensing unit of claim 47, wherein the first mesh pattern is located on the light absorbing pattern.

49. The input sensing unit of claim 47, wherein the light absorbing pattern is located on the second mesh pattern.

50. The input sensing unit of claim 41, wherein the sensing electrode comprises:
   a first sensing electrode extending in a first direction; and
   a second sensing electrode extending in a second direction intersecting the first direction,
   wherein the first sensing electrode includes a plurality of first sensing portions arranged along the first direction and a plurality of first connecting portions connecting the first sensing portions to each other,
   wherein the second sensing electrode includes a plurality of second sensing portions arranged along the second direction and a plurality of second connecting portions connecting the second sensing portions to each other,
   wherein the plurality of first sensing portions and the plurality of second sensing portions are disposed on the same layer or on different layers, and
   wherein either the plurality of first connecting portions or the plurality of second connecting portions are disposed on the same layer as the first sensing portions.

51. The input sensing unit of claim 29, further comprising a reflection preventing unit configured for preventing external light incident on the display device from being reflected in the display device and going out.

52. The input sensing unit of claim 51, wherein the reflection preventing unit is provided on the input sensing unit, and
   wherein the light absorbing pattern is configured to absorb light incident on the light absorbing pattern among the external light reflected in the display device.

* * * * *